(12) United States Patent
Baba et al.

(10) Patent No.: US 8,222,677 B2
(45) Date of Patent: Jul. 17, 2012

(54) SEMICONDUCTOR MEMORY DEVICE AND METHOD OF MANUFACTURING THE SAME

(75) Inventors: Yasuyuki Baba, Yokohama (JP); Hiroyuki Nagashima, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 595 days.

(21) Appl. No.: 12/399,376

(22) Filed: Mar. 6, 2009

(65) Prior Publication Data

US 2010/0032725 A1 Feb. 11, 2010

(30) Foreign Application Priority Data

Aug. 8, 2008 (JP) ................. 2008-205339

(51) Int. Cl.
*H01L 29/00* (2006.01)
(52) U.S. Cl. .................. 257/211; 257/E29.001
(58) Field of Classification Search .......... 257/208, 257/211, E25.013, E23.011
See application file for complete search history.

(56) References Cited

U.S. PATENT DOCUMENTS

| | | | | |
|---|---|---|---|---|
| 6,365,419 | B1* | 4/2002 | Durlam et al. ............ | 438/3 |
| 7,821,058 | B2* | 10/2010 | Kidoh et al. ............ | 257/324 |
| 2001/0029100 | A1* | 10/2001 | Huang et al. ............ | 438/638 |

FOREIGN PATENT DOCUMENTS

JP 2010-171332 8/2010

OTHER PUBLICATIONS

U.S. Appl. No. 12/508,877, filed Jul. 24, 2009, Yamamoto, et al.
U.S. Appl. No. 12/886,090, filed Sep. 20, 2010, Minemura, et al.
U.S. Appl. No. 13/033,026, filed Feb. 23, 2011, Nitta.
U.S. Appl. No. 13/040,018, filed Mar. 3, 2011, Ishibashi.

* cited by examiner

*Primary Examiner* — Zandra Smith
*Assistant Examiner* — Paul Patton
(74) *Attorney, Agent, or Firm* — Oblon, Spivak, McClelland, Maier & Neustadt, L.L.P.

(57) ABSTRACT

A semiconductor memory device comprises a semiconductor substrate; a cell array block formed on the semiconductor substrate and including plural stacked cell array layers each comprising a plurality of first lines, a plurality of second lines crossing the plurality of first lines, and memory cells connected at intersections of the first and second lines between both lines; and a plurality of contact plugs extending in the stack direction of the cell array layers to connect between the first lines, between the second lines, between the first or second line and the semiconductor substrate, or between the first or second line and another metal line, in the cell array layers. The first or second line in a certain one of the cell array layers has a contact connector making contact with both sides of the contact plug.

13 Claims, 19 Drawing Sheets

US 8,222,677 B2

SEMICONDUCTOR MEMORY DEVICE AND METHOD OF MANUFACTURING THE SAME

CROSS-REFERENCE TO RELATED APPLICATION

This application is based upon and claims the benefit of priority from the prior Japanese Patent Application No. 2008-205339, filed on Aug. 8, 2008, the entire contents of which are incorporated herein by reference.

BACKGROUND OF THE INVENTION

1. Field of the Invention

The present invention relates to a semiconductor memory device, and more particularly to a nonvolatile semiconductor memory device having a stacked structure.

2. Description of the Related Art

Electrically erasable programmable nonvolatile memories include a flash memory as well known in the art, which comprises a memory cell array of NAND-connected or NOR-connected memory cells having a floating gate structure. A ferroelectric memory is also known as a nonvolatile fast random access memory.

On the other hand, technologies of pattering memory cells much finer include a resistive memory, which uses a variable resistive element in a memory cell as proposed. Known examples of the resistive element include a phase change memory element that varies the resistance in accordance with the variation in crystal/amorphous states of a chalcogenide compound; an MRAM element that uses a variation in resistance due to the tunnel magneto-resistance effect; a polymer ferroelectric RAM (PFRAM) memory element including resistors formed of a conductive polymer; and a memory element that causes a variation in resistance on electrical pulse application (Patent Document 1: JP 2006-344349A, paragraph 0021).

The resistive memory may configure a memory cell with a serial circuit of a Schottky diode and a variable resistive element in place of the transistor. Accordingly, it can be stacked easier and three-dimensionally structured to achieve much higher integration advantageously (Patent Document 2: JP 2005-522045A).

Many of the semiconductor memory devices having such the stacked structure include a contact plug for connecting a line in a certain memory layer to a line in a different memory layer. Further, at an end of the line in each memory layer, a contact connector is formed for connection to the contact plug. Therefore, there is a need for providing space for formation of the contact plug and the contact connector, which not only results in an increase in chip area but also, depending on the connection state, causes variations in electrical property among lines in the memory layers as a problem.

SUMMARY OF THE INVENTION

In an aspect the present invention provides a semiconductor memory device, comprising: a semiconductor substrate; a cell array block formed on the semiconductor substrate and including plural stacked cell array layers each comprising a plurality of first lines, a plurality of second lines crossing the plurality of first lines, and memory cells connected at intersections of the first and second lines between both lines; and a plurality of contact plugs extending in the stack direction of the cell array layers to connect between the first lines, between the second lines, between the first or second line and the semiconductor substrate, or between the first or second line and another metal line, in the cell array layers. The first or second line in a certain one of the cell array layers has a contact connector making contact with both sides of the contact plug.

In another aspect the present invention provides a semiconductor memory device, comprising: a semiconductor substrate; a cell array block formed on the semiconductor substrate and including plural stacked cell array layers each comprising a plurality of first lines, a plurality of second lines crossing the plurality of first lines, and memory cells connected at intersections of the first and second lines between both lines; and a plurality of contact plugs extending in the stack direction of the cell array layers to connect between the first lines, between the second lines, between the first or second line and the semiconductor substrate, or between the first or second line and another metal line, in the cell array layers. The first or second line in a certain one of the cell array layers has a pair of contact connectors formed sandwiching the side of the contact plug from both sides.

In an aspect the present invention provides a method of manufacturing semiconductor memory devices, comprising: forming on a semiconductor substrate a plurality of multilayered cell array layers each comprising first and second mutually crossing lines and memory cells connected at intersections of the first and second lines between both lines; forming contact connectors in the first and second lines using a mask having two convex shapes with a certain gap; forming penetrated holes through the gaps in the contact connectors formed in the cell array layers; and forming contact plugs extending in the stack direction of the cell array layers by filling the formed penetrated holes with a conductive material to connect the first or second line in the cell array layer with the semiconductor substrate individually.

DETAILED DESCRIPTION OF THE EMBODIMENTS

The embodiments associated with the semiconductor memory device according to the present invention will now be described in detail with reference to the drawings.

[First Embodiment]

Figure 1:
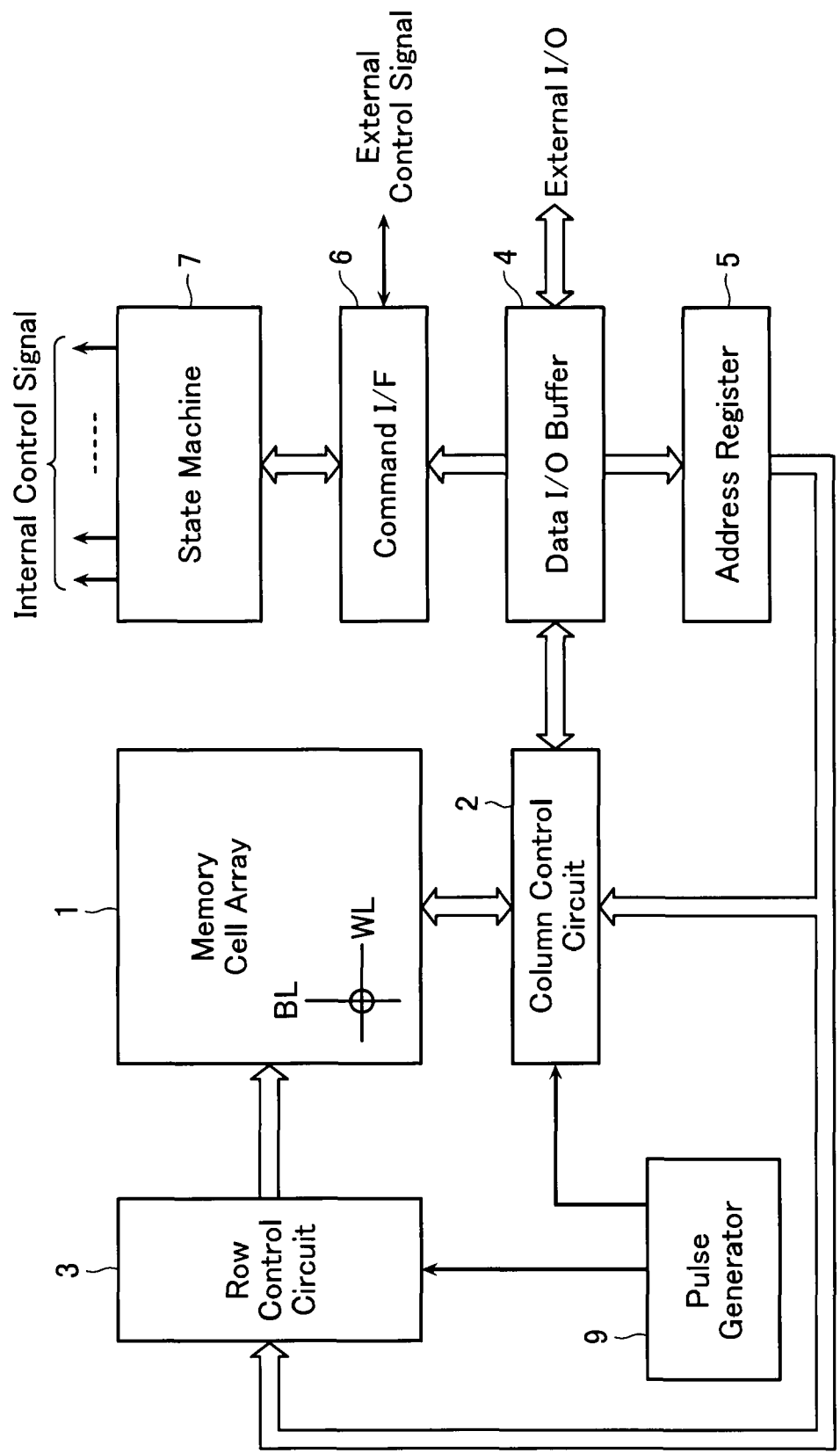
FIG. 1 is a block diagram of a semiconductor memory device according to a first embodiment of the present invention.

FIG. 1 is a block diagram of a semiconductor memory device according to a first embodiment of the present invention.

This semiconductor memory device comprises a cell array block, which includes plural memory cell arrays 1 stacked. Each memory cell array is composed of memory cells arranged in matrix, using a later-described ReRAM (resistive element) or the like. A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell.

A data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent via an address register 5 to the column control circuit 2 and the row control circuit 3. A command fed from the host to the data I/O buffer 4 is sent to a command interface 6. The command interface 6 receives an external control signal from the host and decides whether the data fed to the data I/O buffer 4 is write data, a command or an address. If it is a command, then the command interface transfers it as a received command signal to a state machine 7. The state machine 7 manages the entire semiconductor memory device to receive commands from the host, read, write, erase, and execute data I/O management. The external host can also receive status information managed by the state machine 7 and decide the operation result. The status information is also utilized in control of write and erase.

The state machine 7 controls the pulse generator 8. Under this control, the pulse generator 8 is allowed to provide a pulse of any voltage at any timing. Specifically, the state machine 7 receives an address fed from external via the address resistor 5, determines which memory layer is accessed, and uses the parameter corresponding to the memory layer to control the height/width of the pulse from the pulse generator 8. This parameter is a value, which is obtained by grasping write characteristics and so forth in memory layers and then evening the write characteristics in the memory layers, and stored in memory cells. The pulse formed herein can be transferred to any line selected by the column control circuit 2 and the row control circuit 3.

Peripheral circuit elements other than the memory cell array 1 can be formed in a silicon substrate immediately beneath the memory cell array 1. Thus, the chip area of the semiconductor memory device can be made almost equal to the area of the memory cell array 1.

Figure 2:
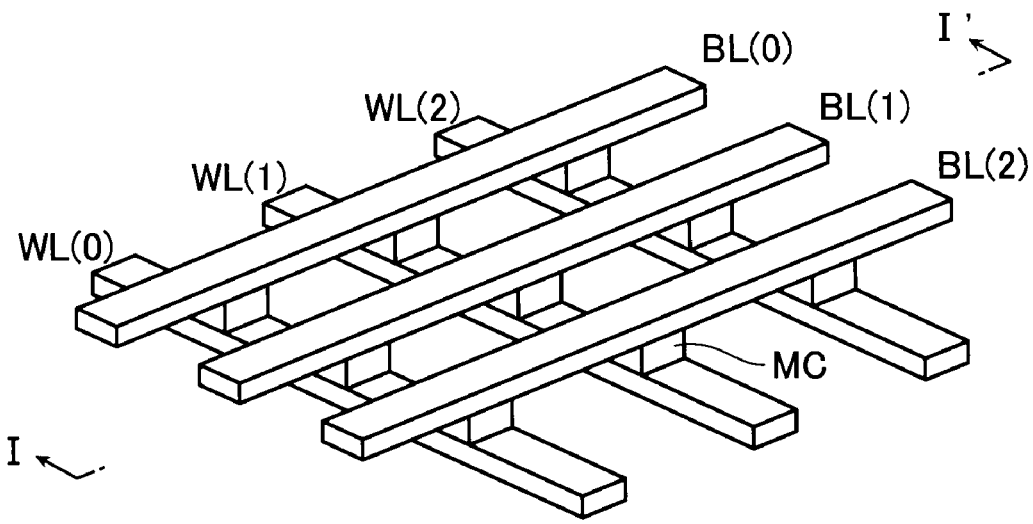
FIG. 2 is a perspective view showing part of a memory cell array in the semiconductor memory device according to the same embodiment.
Figure 3:
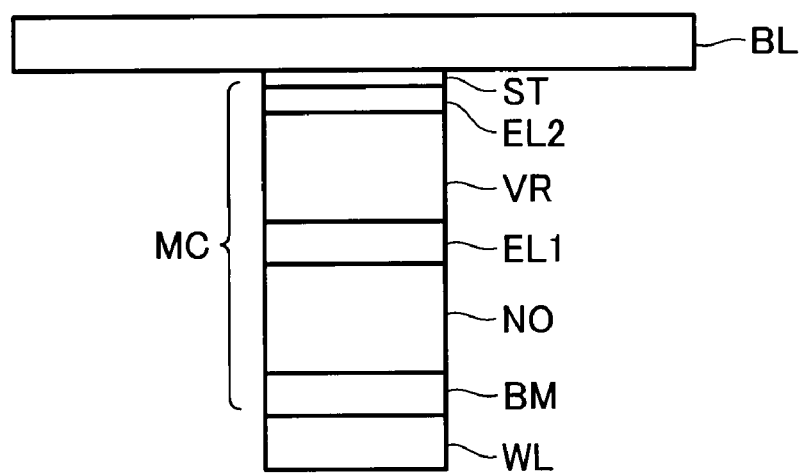
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or bit lines BL(0)-BL(2) disposed in parallel, which cross plural second lines or word lines WL(0)-WL(2) disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistive element VR and a non-ohmic element NO as shown in FIG. 3.

The variable resistive element VR can vary the resistance through current, heat, or chemical energy on voltage application. Arranged on an upper and a lower surface thereof are electrodes EL2, EL1 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

Available examples of the variable resistive element VR include: one that changes the resistance in accordance with a phase change between the crystalline state and the amorphous state, such as a chalcogenide (PCRAM); one that changes the resistance by precipitating metal cations to form a bridge (conducting bridge) between electrodes and ionizing the precipitated metal to destruct the bridge (CBRAM); and one that changes the resistance by applying a voltage or current (ReRAM) (which is roughly divided into two: one that causes a variation in resistance in accordance with the presence/absence of charge trapped in charge traps present in the electrode interface, and one that causes a variation in resistance in accordance with the presence/absence of the conduction path due to an oxygen loss and so forth).

Figure 4:
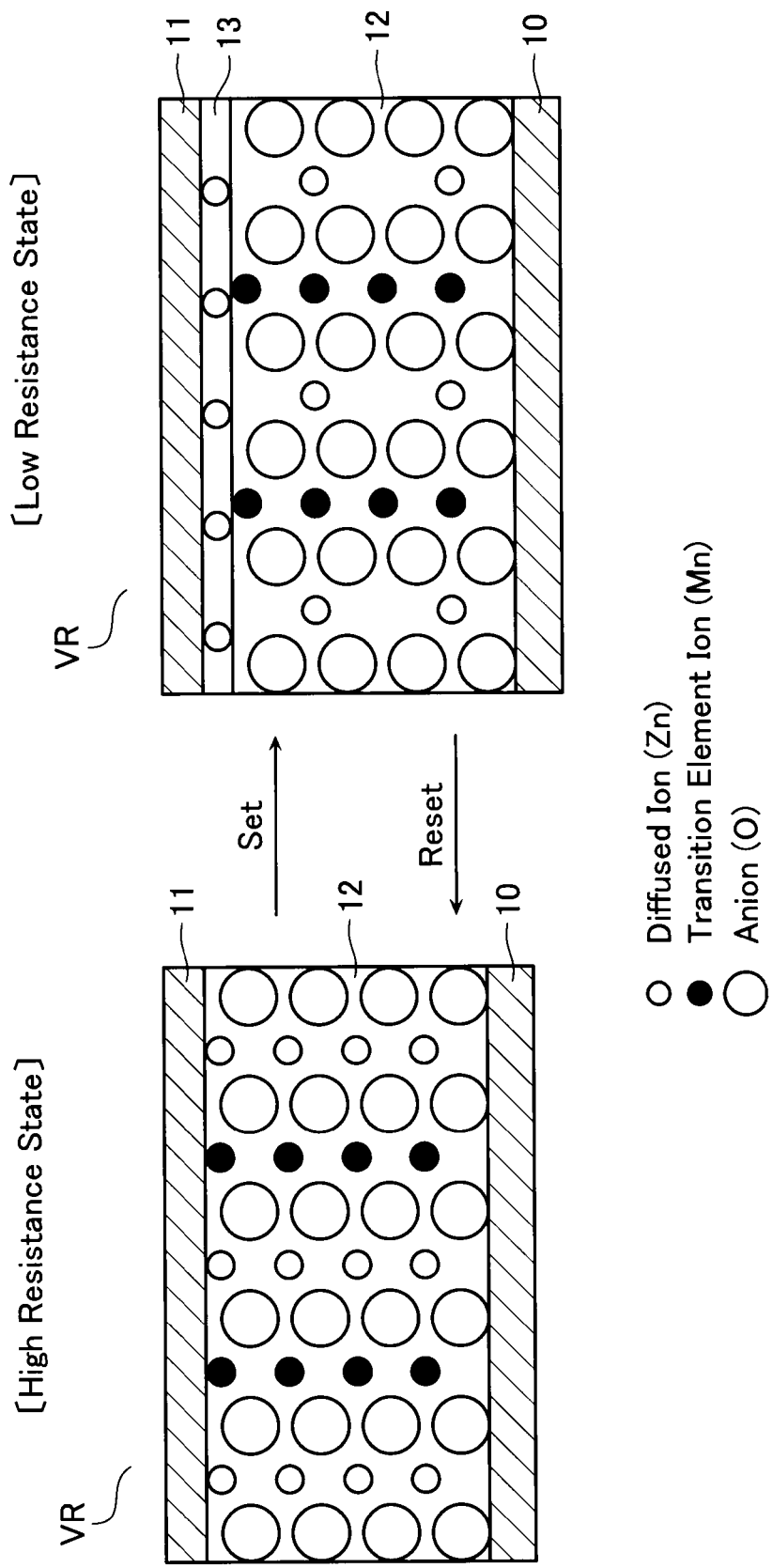
FIG. 4 is a schematic cross-sectional view showing a variable resistive element example in the semiconductor memory device according to the same embodiment.

FIG. 4 shows an example of the variable resistive element VR. The variable resistive element VR shown in FIG. 4 includes a recording layer 12 arranged between electrode layers 10, 11. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 10 is kept at a fixed potential and a negative voltage is applied to the electrode layer 11, part of diffused ions in the recording layer 12 migrate toward the electrode layer 11 to reduce diffused ions in the recording layer 12 relative to anions. The diffused ions arrived at the electrode layer 11 accept electrons from the electrode layer 11 and precipitate as a metal, thereby forming a metal layer 11. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for sufficient time, which causes Joule heating to facilitate the oxidation reduction reaction in the recording layer 12. Application of an electric field in the opposite direction from that at the time of setting may also allow resetting.

Between the electrode EL2 and the bit line BL, a stopper ST composed of tungsten (W) is provided. This is operative to play a role in stopping the planarization by CMP at a certain position in the stack direction during the process step of manufacturing the semiconductor memory device later described.

Figure 5:
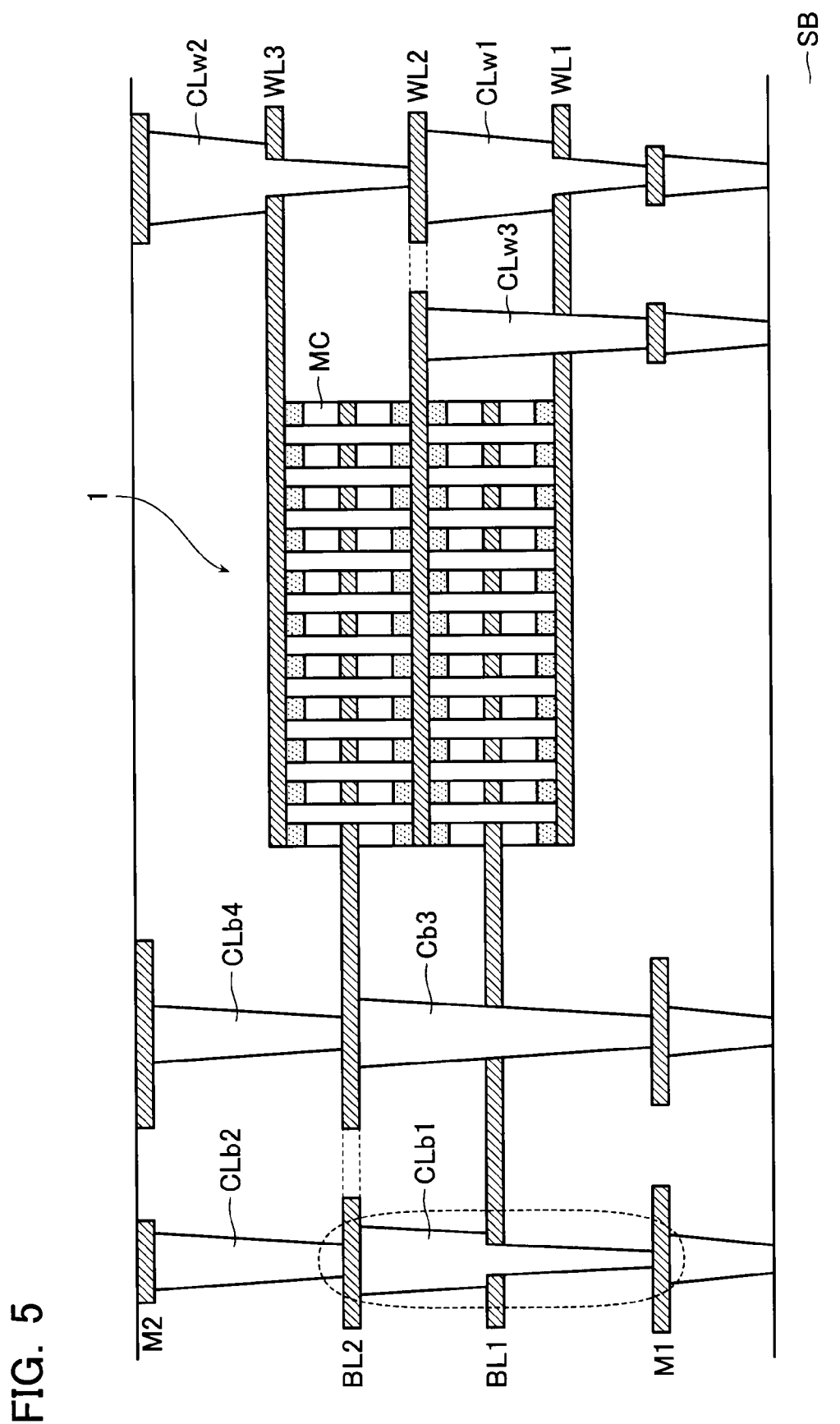
FIG. 5 is a brief diagram showing connections among word lines, bit lines and contact plugs in the semiconductor memory device according to the same embodiment.

FIG. 5 is a brief diagram showing connections among word lines WL, bit lines BL and contact plugs CL in the semiconductor memory device according to the present embodiment.

This semiconductor memory device includes plural bit lines BL1, BL2 arranged between a metal line M1 in the lowermost layer and a metal line M2 in the uppermost layer in a stacked structure formed on a semiconductor substrate SB. Between the metal line M1 and the bit line BL1, between the bit lines BL1 and BL2, and between the bit line BL2 and the metal line M2, plural word lines WL1, WL2, WL3 crossing the bit lines BL are arranged, respectively. At each intersection of the word line WL1 and the bit line BL1, of the bit line BL1 and the word line WL2, of the word line WL2 and the bit line BL2, and of the bit line BL2 and the word line WL3, a memory cells MCs shown in FIG. 3 are connected, respectively. Thus configured is a four-layer structured memory cell array 1. The memory cells MC adjoining in the stack direction share a bit line BL or a word line WL.

The certain word lines WL2, WL3 and the metal line M2 are connected at the ends of the word lines WL2, WL3 with a contact plug CLw2 extending in the stack direction. The contact plug CLw2 is shaped in a frustum gradually tapered from the metal line M2 toward the certain word line WL2 and has a step formed above the upper surface of the word line WL3. Formed at the end of the certain word line WL3 is a contact connector, which includes two parallel plates portions formed sandwiching both sides of the contact plug CLw2 immediately beneath the step. This brings the certain word lines WL2, WL3 and the metal line M2 almost at equipotential. Similarly, the certain word line WL2 and the metal line M1 are connected at the ends of the word lines WL2, WL1 with a contact plug CLw1 extending in the stack direction. The contact plug CLw1 also has a step formed above the upper surface of the word line WL1. Formed at the end of the word line WL1 is a contact connector, which includes two parallel plates portions formed sandwiching both sides of the contact plug CLw1 immediately beneath the step.

Another contact plug CLw3 extending in the stack direction may be formed, if required, to bring the certain word line WL2 in contact with the semiconductor substrate SB.

On the other hand, there are contact plugs CLb1-CLb4 extending in the stack direction formed between the metal lines M1, M2 and the bit lines BL1, BL2 as well. The figure expresses the contact plugs CLb1-CLb4 for the bit lines BL1, BL2 as formed on the opposite side of the memory cell array 1 from the contact plugs CLw1-CLw4 for the word lines WL1-WL3 though the contact plugs CLb1-CLb4 are actually formed on one side in the direction of the bit lines BL1, BL2 extending. The contact plug CLb1 connects the certain bit lines BL2, BL1 with the metal line M1. Similarly, the contact plugs CLb2, CLb3, CLb4 connect the metal line M2 with the bit line BL2, the bit line BL2 with the metal line M1, and the metal line M2 with the bit line BL2, respectively.

(Shapes of Ends of Bit Lines and Word Lines)

The shapes of ends of the bit lines BL and the word lines WL are described next.

Figure 6:
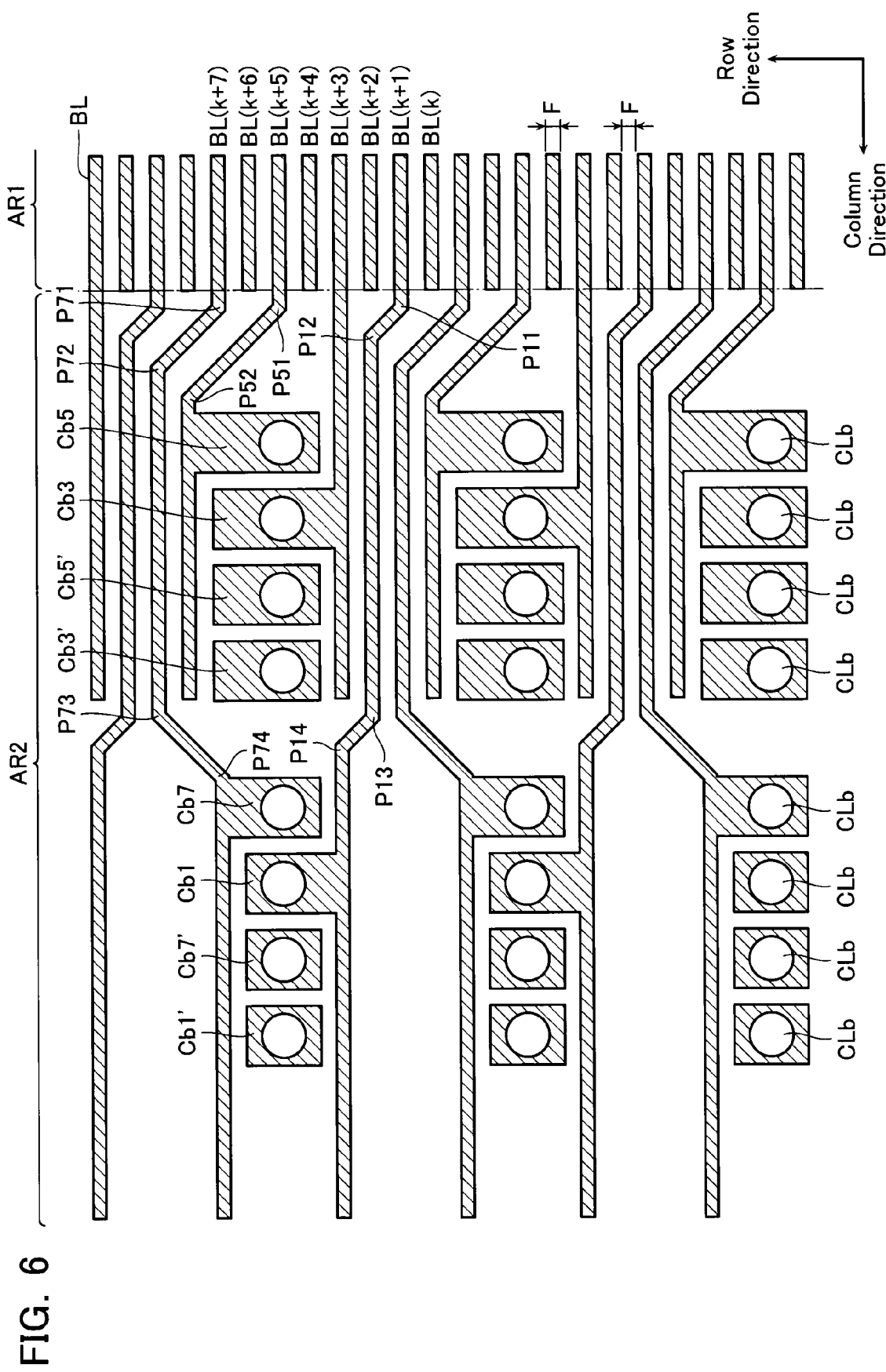
FIG. 6 is a top view of bit lines in the semiconductor memory device according to the same embodiment.

FIG. 6 shows the shapes of ends of the bit lines BL (for example, BL2 in FIG. 5) having a contact connector formed therein, through which no contact plug CLb penetrates.

The bit lines BL are formed over a memory cell area AR1 with the memory cells MC arranged and a peripheral area AR2 with the contact plugs CLb arranged (in the following description, the direction in parallel with the bit line BL and directing from the peripheral area AR2 to the memory cell area AR1 is referred to as the "column direction", and the direction in parallel with the word line WL and orthogonal to the column direction is referred to as the "row direction").

Plural bit lines BL are formed with a certain width (for example, 43 nm) and arranged in parallel with each other in the row direction at intervals of a length F.

The k-th (k is an integer) bit line BL(k) counted from a certain position in the row direction extends within the memory cell area AR1 to the boundary with the peripheral area AR2 in the column direction.

The (k+1)-th bit line BL(k+1) extends within the memory cell area AR1 to the boundary with the peripheral area AR2 in the column direction and then extends in the column direction via a position P11 at a distance 2F in the column direction from this position, a position P12 at a distance 2F in the column direction and a distance 2F in the row direction from the position P11, a position P13 at a distance 26F in the column direction from the position P12, and a position P14 at a distance 2F in the column direction and a distance 2F in the row direction from the position P13. There is formed a rectangular contact connector Cb1 having apexes on a position at a distance 7F in the column direction from the position P14, and a position at a distance 4F in the column direction and a distance 6.5F in the row direction from this position.

The (k+2)-th bit line BL(k+2) extends within the memory cell area AR1 to the boundary with the peripheral area AR2 in the column direction.

The (k+3)-th bit line BL(k+3) extends within the memory cell area AR1 to the boundary with the peripheral area AR2 in the column direction and then extends in the column direction to a position at a distance 28F from this position. There is formed a rectangular contact connector Cb3 having apexes on a position at a distance 14F in the column direction from the boundary between the areas AR1 and AR2, and a position at a distance 4F in the column direction and a distance 8.5F in the row direction from this position.

The (k+4)-th bit line BL(k+4) extends within the memory cell area AR1 to the boundary with the peripheral area AR2 in the column direction.

The (k+5)-th bit line BL(k+5) extends within the memory cell area AR1 to the boundary with the peripheral area AR2 in the column direction and then extends in the column direction via a position P51 at a distance 2F in the column direction from this position, and a position P52 at a distance 6F in the column direction and a distance 6F in the row direction from the position P51, then to a position at a distance 20F in the column direction from the position P52. There is formed a rectangular contact connector Cb5 having apexes on a position at a distance 1F in the column direction and a distance −8.5F in the row direction from the position P52, and a position at a distance 4F in the column direction and a distance 8F in the row direction from this position.

The (k+6)-th bit line BL(k+6) extends within the memory cell area AR1 to the boundary with the peripheral area AR2 in the column direction.

The (k+7)-th bit line BL(k+7) extends within the memory cell area AR1 to the boundary with the peripheral area AR2 in the column direction and then extends in the column direction via a position P71 at a distance 2F in the column direction from this position, a position P72 at a distance 4F in the column direction and a distance 4F in the row direction from the position P71, a position P73 at a distance 24F in the column direction from the position P72, and a position P74 at a distance 4F in the column direction and a distance −4F in the row direction from the position P73. There is formed a rectangular contact connector Cb7 having apexes on a position at a distance −6.5F in the column direction from the position P74, and a position at a distance 4F in the column direction and a distance 6.5F in the row direction from this position.

There are also formed island-shaped contact connectors Cb1', Cb3', Cb5', Cb7', which are not connected to any of the bit lines BL(k)-BL(k+7).

The contact connector Cb1' is a rectangular area having apexes on a position at a distance 15F in the column direction and a distance 6.5F in the row direction from the position P74, and a position at a distance 4F in the column direction and a distance 5F in the row direction from this position.

The contact connector Cb3' is a rectangular area having apexes on a position at a distance 16F in the column direction and a distance −8.5F in the row direction from the position P52, and a position at a distance 4F in the row direction and a distance 7F in the column direction from this position.

The contact connector Cb5' is a rectangular area having apexes on a position at a distance 11F in the column direction and a distance −8.5F in the row direction from the position P52, and a position at a distance 4F in the row direction and a distance 7F in the column direction from this position.

The contact connector Cb7' is a rectangular area having apexes on a position at a distance 10F in the column direction and a distance 6.5F in the row direction from the position P14, and a position at a distance 4F in the column direction and a distance 5F in the row direction from this position.

These contact connectors Cb1', Cb3', Cb5' and Cb7' have surfaces not shown, which are connected via the contact plugs CLb to the bit lines BL in the lower layer. On the other hand, the shown surfaces are connected via the contact plugs CLb to the bit lines BL in the upper layer. In a word, the contact connectors Cb1', Cb3', Cb5' and Cb7' relay the connections between the bit lines BL in the lower and upper layers.

The above-described bit lines BL(k)-BL(k+7) and contact connectors Cb1', Cb3', Cb5' and Cb7' form a layout pattern, which is repeatedly arranged in the row direction.

Figure 7:
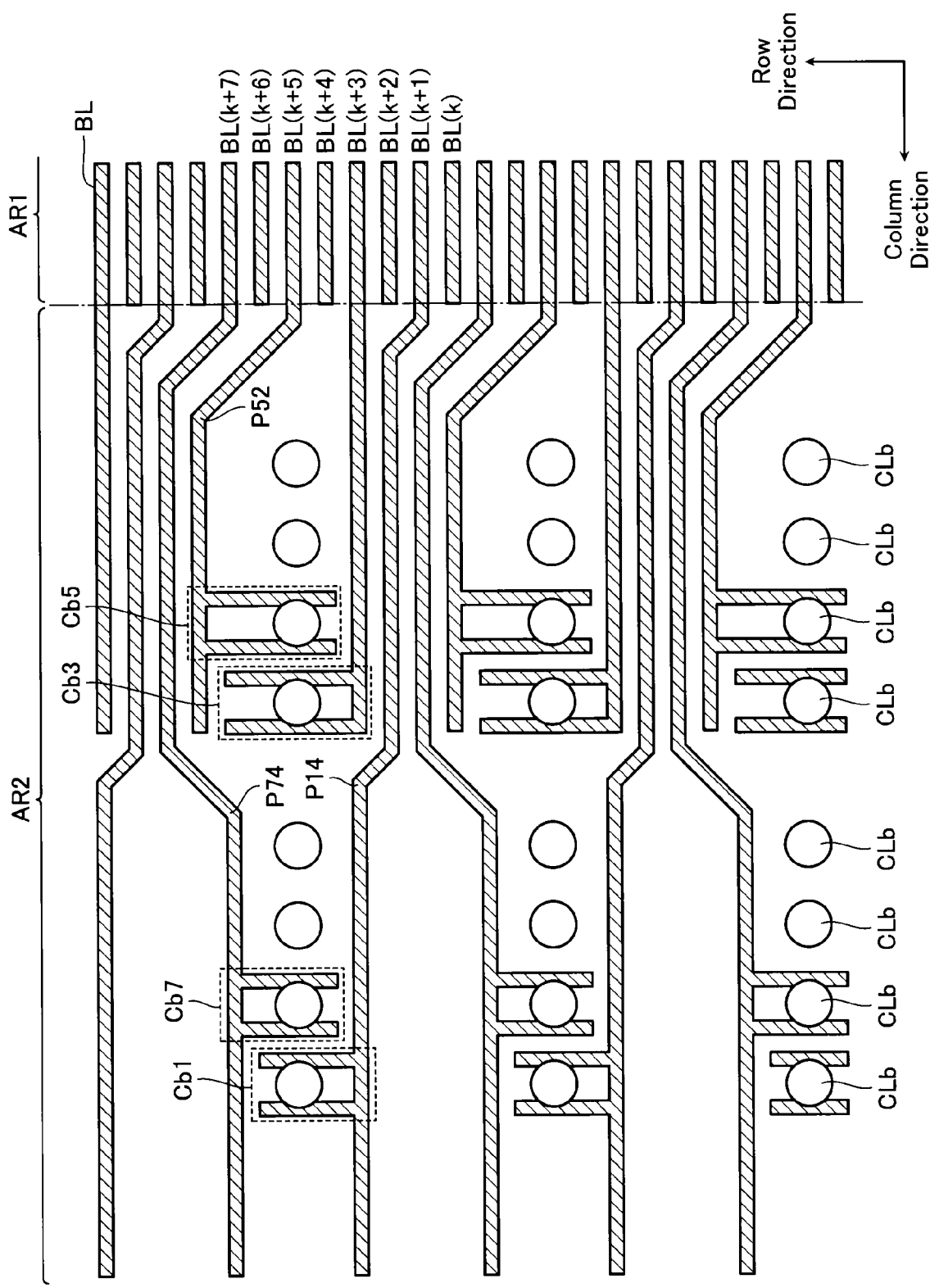
FIG. 7 is a top view of bit lines in the semiconductor memory device according to the same embodiment.

FIG. 7 shows the shapes of ends of the bit lines BL (for example, BL1 in FIG. 5) having a contact connector formed therein, through which the contact plug CLb penetrates.

FIG. 7 is similar in layout to FIG. 6 except for the contact connectors Cb.

The contact connector Cb1 in the bit line BL(k+1) is formed in a rectangular area having apexes on a position at a distance 12F in the column direction from the position P14, and a position at a distance 4F in the column direction and a distance 6.5F in the row direction from this position.

The contact connector Cb3 in the bit line BL(k+3) is formed in a rectangular area having apexes on a position at a distance 24F in the column direction and a distance 0.5F in the row direction from the position of the bit line BL(k+3) intersecting the boundary surface between the memory cell area AR1 and the peripheral area AR2, and a position at a distance 4F in the column direction and a distance 8F in the row direction from this position.

The contact connector Cb5 in the bit line BL(k+5) is formed in a rectangular area having apexes on a position at a distance 11F in the column direction and a distance −8.5F in the row direction from the position P52, and a position at a distance 4F in the column direction and a distance 8F in the row direction from this position.

The contact connector Cb7 in the bit line BL(k+7) is formed in a rectangular area having apexes on a position at a distance 10F in the column direction and a distance −6.5F in the row direction from the position P74, and a position at a distance 4F in the column direction and a distance 6F in the row direction from this position.

The contact connector Cb shown in FIG. 7 differs in shape from the contact connector Cb shown in FIG. 6. Specifically, it includes two plate portions projected in the direction orthogonal to the bit line BL. These two plate portions are formed sandwiching both sides of the contact plug CLb and arranged in contact with the step formed on the side of the contact plug CLb. Thus, each bit line BL can be connected, via the contact connector Cb thereof and the contact plug CLb surrounded by the contact connector Cb, to a bit line BL in a different layer.

In FIGS. 6 and 7 the bit lines BL are described while the word lines WL are similarly shaped except that the column direction and the row direction are changed from each other.

The following description is given to the sizes of the contact connector Cb and the contact plug CLb.

Figure 8:
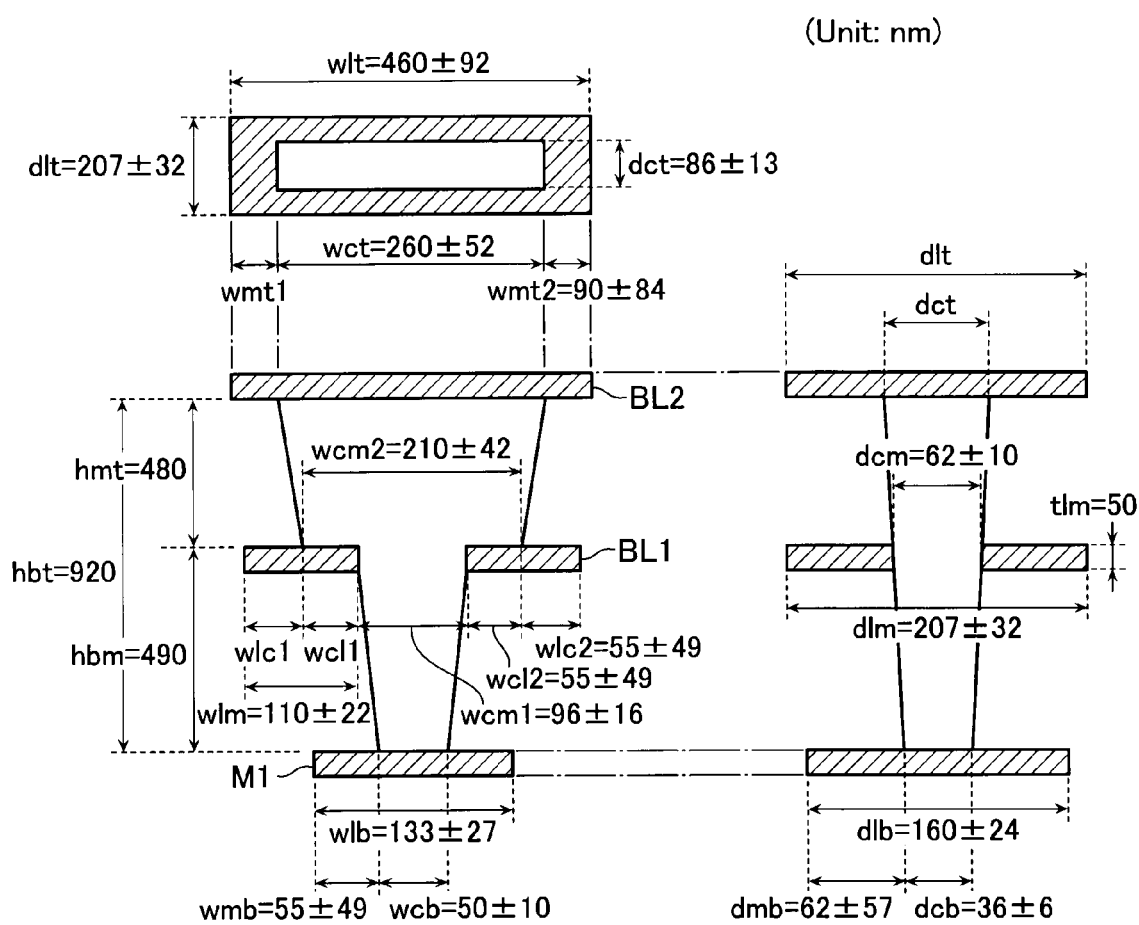
FIG. 8 shows sectioned shapes of a contact connector and a contact plug with a word line used as a surface normal in the semiconductor memory device according to the same embodiment.

FIG. 8 shows shapes of the contact connector Cb and the contact plug CLb in a portion surrounded by a dotted-line in FIG. 5. The indications of lengths at various locations in the figure are values calculated under the condition for ensuring a contact width, 60 nm or more, between the contact connector Cb in the bit line BL1 and the contact plug CLb, and a width, wcm1=80 nm or more, of the contact plug CLb at the height of the bit line BL1. In addition, the height from the metal line M1 to the bit line BL1 top is hbm=490 nm, the height from the bit line BL1 top to the bit line BL2 bottom is hmt=480 nm, and the thickness of the bit line BL1 is tlm=50 nm.

At the beginning, the sizes in the column direction are determined.

First, the width wlm of the plate portions formed as sandwiching the contact plug, the interval wcm1 between two plate portions, and the width wcm2 of the contact plug at the height of the bit line BL1 top are determined. On the assumption that wlm has a variation of ±20%, wcl2 has a variation of ±20%, and the contact connector Cb in the bit line BL1 and the contact plug CLb have an alignment error of 25 nm, the following equations (1), (2) are established to ensure a margin of 5 nm.

[Equation 1]

$$wcm2 = 1.2 \times wlm + 80 \qquad (1)$$

[Equation 2]

$$\frac{wlm}{2} - \sqrt{\left(\frac{0.2 \times wlm}{2}\right)^2 + \left(\frac{0.2 \times wcm2}{2}\right)^2} - \sqrt{25^2} > 5 \qquad (2)$$

The equations (1), (2) yield wlm≈110 nm, and wcm2≈210 nm. Therefore, when the variation of ±20% in wlm and the variation of ±20% in wcl2 are taken into account, wlm=110 ±22 nm, wcm2=210±42 nm, and wcm1=96±16 nm are determined.

Subsequently, the width wct of the bit line BL2 bottom (the contact plug CLb top) and the width of the contact connector Cb in the bit line BL2 are determined. If the contact plug herein has a taper angle of 87°, then wct can be derived as wct≈260 nm from the following.

[Equation 3]

$$wct = \frac{hmt}{\tan 87°} \times 2 + wcm2 \qquad (3)$$

Therefore, the dimensional variation of 20% in wct is taken into account to determine wct=260±52 nm. In addition, when the dimensional variation of 20% in the contact connector in the bit line BL2, the variation of ±0.5% in taper angle, the spec alignment error of 25 nm in the bit line BL2 direction, and the dimensional variation of 20% in the width wlt itself of the contact connector in the bit line BL2 are taken into account, the width wlt of the contact connector in the bit line BL2 is determined as 460±92 nm.

Subsequently, the width wcb of the bit line BL1 top (the contact plug CLb bottom), and the width wlb of the contact connector in the metal line M1 are determined. If the contact plug herein has a taper angle of 87°, then wcb can be derived as wcb≈50 nm from the following.

[Equation 4]

$$wcb = wcm1 - 2 \times \frac{(hbm - tlm)}{\tan 87°} \qquad (4)$$

Therefore, when the dimensional variation of 20% in wcb is taken into account, wcb=50±10 nm is determined. In addition, when the dimensional variation of 20% in the contact connector in the metal line M1, the variation of ±0.5% in taper angle, the spec alignment error of 25 nm in the metal line M1 direction, and the dimensional variation of 20% in the width wlb itself of the contact connector in the metal line M1 are taken into account, the width wlt of the contact connector in the metal line M1 is determined as 133±27 nm.

The sizes in the row direction are determined next.

First, the depth dcb of the contact plug CLb bottom is determined. A 43 nm-generation NAND flash memory has an area of 43 nm×43 nm in the contact plug bottom and accordingly a need for ensuring almost the same area results in dcb≈36 nm from the width wcb=50 nm of the contact plug CLb bottom previously obtained. When the dimension variation of 15% in dcb is taken into account, dcb=36±10 nm is determined. If the contact connector in the metal line M1 has a depth, dlb, and the contact connector in the metal line M1 has a fringe, dmb, in the word line WL direction, then a need for ensuring a margin of 5 nm establishes the following equations (5), (6).

[Equation 5]

$$dlb = 2 \times dmb + dcb \qquad (5)$$

[Equation 6]

$$dmb - \sqrt{\left(\frac{0.15 \times dmb}{2}\right)^2 + \left(\frac{0.2 \times dcb}{2}\right)^2} - \sqrt{25^2 + 25^2 + 25^2} > 5 \qquad (6)$$

The equations (5), (6) yield dmb≈62 nm, and dlb≈160 nm. Therefore, when the dimensional variation of 15% in dlb is taken into account, dlb=160±24 nm is determined.

Subsequently, the depth dcm of the contact plug CLb at the height of the bit line BL1 top, and the depth dct of the contact plug dlb at the height of the bit line BL2 bottom are determined. If the contact plug herein has a taper angle of 88.5° in the column direction, then dcm≈62 nm is determined. When the dimensional variation of 15% is taken into account, dcm=62±10 nm is determined. In addition, as for dct≈86 nm, when the dimensional variation of 15% is taken into account, dct=86±13 nm is determined.

Figure 26:
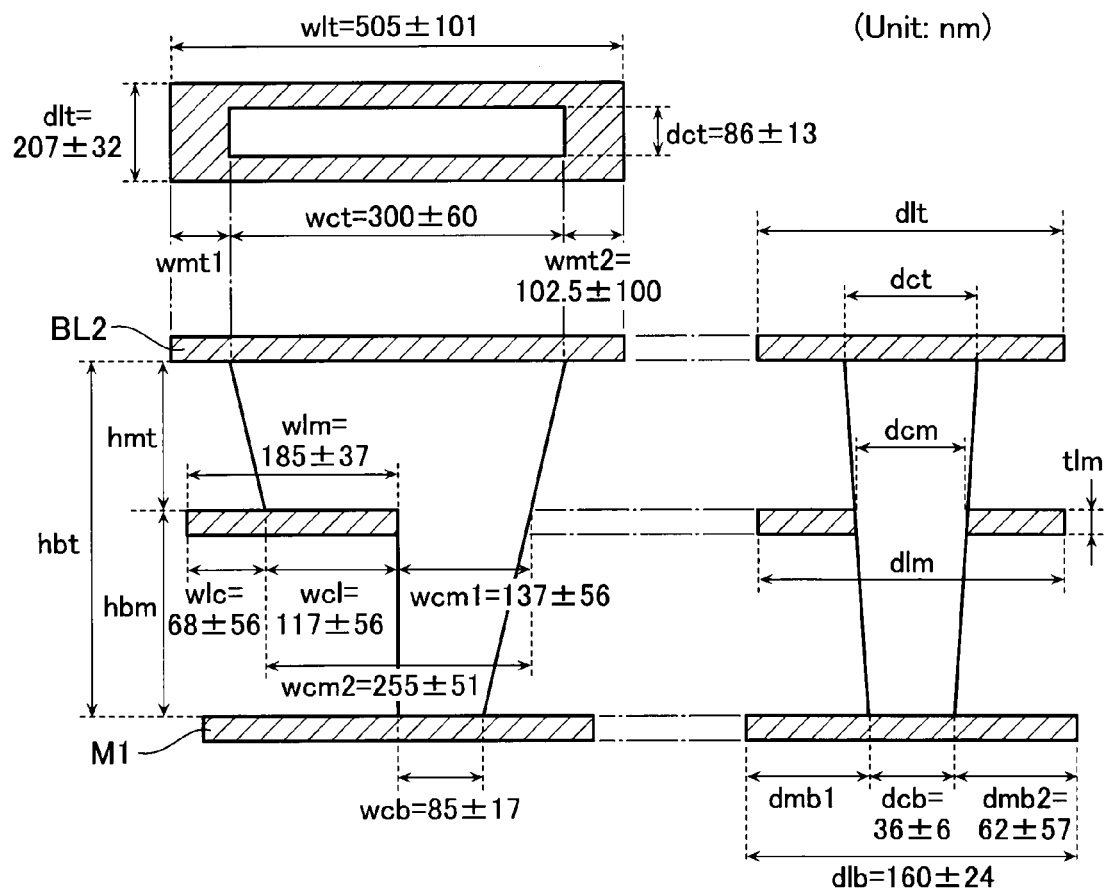
FIG. 26 shows sectioned shapes of a contact connector and a contact plug with a word line used as a surface normal in the same semiconductor memory device.

For reference purpose, FIG. 26 shows the sizes of a contact connector and a contact plug in a semiconductor device according to a comparison example. This is the case of the contact connector and the contact plug of which contact connector formed at an end of the bit line BL has only a plate portion located on one side of the contact plug. The values in the figure are calculated under the condition for ensuring a contact width, wlc=60 nm or more, between the contact connector top in the bit line BL1 and the contact plug, and a width, wcm1=80 nm or more, of the contact plug at the height of the bit line BL1, similar to FIG. 8.

In this case, there is a deviation of 56 nm on the bit line BL201 top in the bit line BL direction when alignment errors such as a dimensional variation in the contact plug are considered. Therefore, wlc=117±56 nm, wcm1=137±56 nm are determined, which lead to a width, wcm2=255±51 nm, on the bit line BL2 top.

If the contact plug CLb has a taper angle of 87° in the bit line BL direction and the alignment error is considered, the widths wct and wcb of the contact plug CLb at the bit line BL1 bottom and the metal line Ml top are determined as wcb=85±17 nm and wct=300±60 nm, respectively. Thus, there is a need for ensuring the width wlt of the contact connector in the bit line BL2 determined as wlt=505±101 nm, for example.

Figure 25:
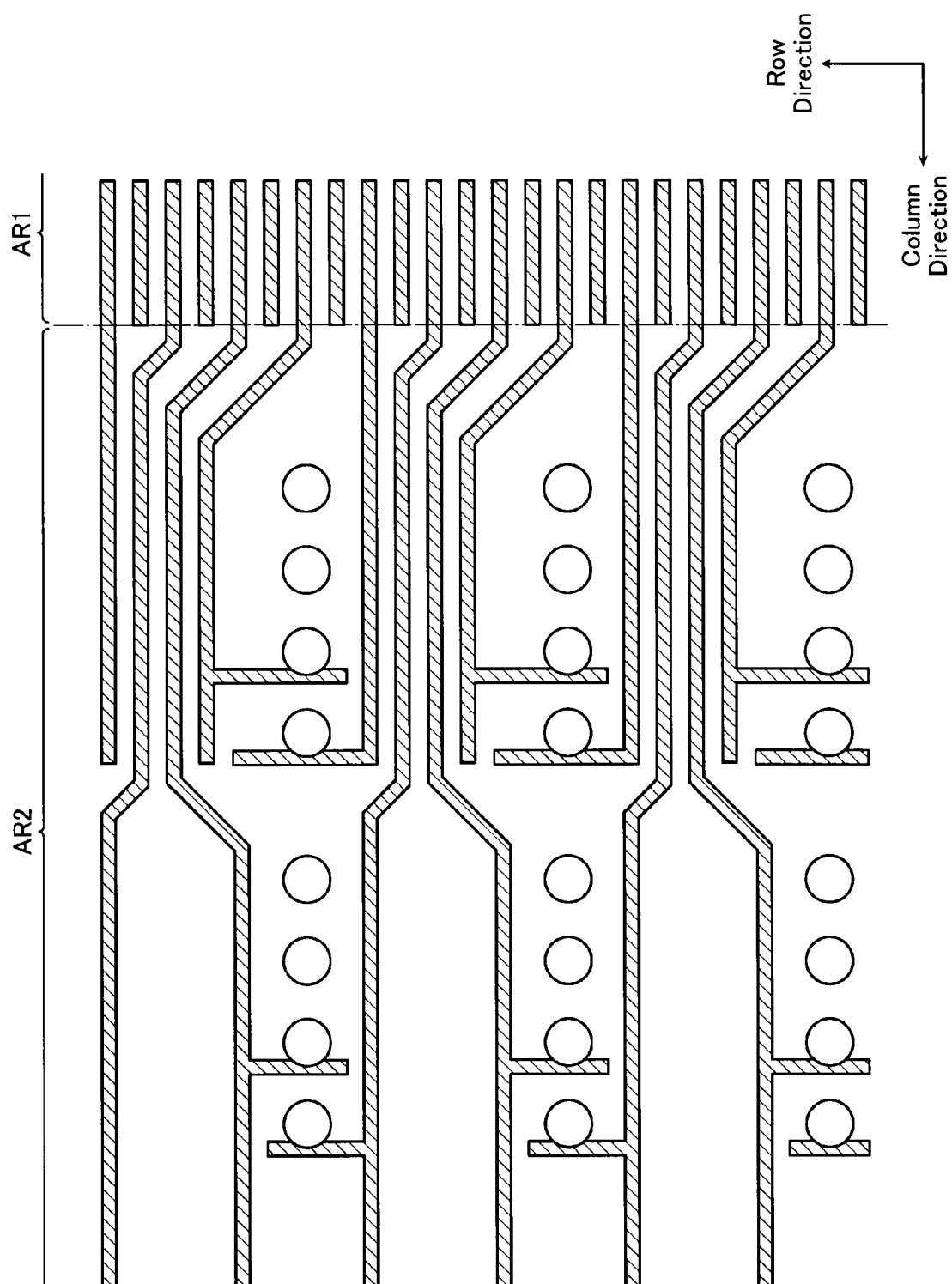
FIG. 25 is a top view of bit lines in a semiconductor memory device of an example in comparison with the first embodiment.

As can be seen from the above, the sizes (widths) of the contact connector and the contact plug in the present embodiment can be made smaller than those in the comparison example shown in FIG. 26 for the following reason. If the contact connector has only a plate portion on one side as is in the comparison example shown in FIG. 26, the contact plug deviates relative to the contact connector and consequently the contact area increases or decreases in proportion to the deviation. Therefore, in addition to the dimensional variations in the contact plug and the contact connector, there is a need for considering the misalignment of the contact plug relative to the contact connector to ensure the contact area. With this regard, the contact connector has two plate portions on both sides of the contact plug in the present embodiment shown in FIG. 8. In this case, even if the contact plug deviates relative to the contact connector to decrease the contact area of one plate portion with the contact plug, the contact area of the other plate portion with the contact plug increases. As a result, a large influence can be prevented from exerting on a total contact area of two plate portions with the contact plug. In a word, the present embodiment shown in FIG. 8 has a stronger structure over the misalignment between the contact connector and the contact plug than the comparison example shown in FIG. 25.

In addition, the contact connector and the contact plug can be downsized and consequently the increase in chip area resulted from ensuring the areas of the contact connector and the contact plug can be suppressed additionally in the present embodiment.

(Process Steps of Manufacturing Semiconductor Memory Device according to Present Embodiment)

FIGS. 9-20 are perspective views showing steps of forming the word line WL1 and much higher layer portions in order of step. The process of forming the upper layer portions are described with reference to FIGS. 9-20 appropriately. For convenience of description, insulators are omitted in part from the figures.

First, an interlayer insulator is formed, and then layers L11-L17 are deposited thereon in turn. The layers L11-L17 are later turned into the word line WL1, the barrier metal BM, the non-ohmic element NO, the electrode EL1, the variable resistive element VR, the electrode EL2 and the stopper ST.

Subsequently, a hard mask of TEOS or the like, not shown, is formed on the upper surface of the above-described stacked structure, and a first anisotropic etching is executed with this mask, thereby forming trenches T1 extending in the column direction at a certain pitch, through the layers L11-L17. The layer L11 is turned into the word line WL1. The contact connector at the end of the word line WL1 is omitted from the figure though the contact connector is formed with a mask of the pattern as shown in FIG. 7.

Then, an interlayer insulator IL11 is buried in the trenches T1. A suitable material of the interlayer insulator IL11 has excellent insulation, a low capacity, and an excellent burial property. Subsequently, a process of planarization by CMP or the like is applied to remove extra parts from the interlayer insulator IL11 and expose the layer L17. The layer L17 (turned into the stopper ST later) plays a role in stopping the planarization by CMP at a certain position in the stack direction.

Subsequently, layers L21-L27 are deposited in turn on the CMP-processed surface. The layers L21-L27 later serve as the bit line BL1, the electrode EL2, the variable resistive element VR, the electrode EL1, the non-ohmic element NO, the barrier metal BM, and the stopper ST. The state up to this step is shown in FIG. 9.

Figure 9:
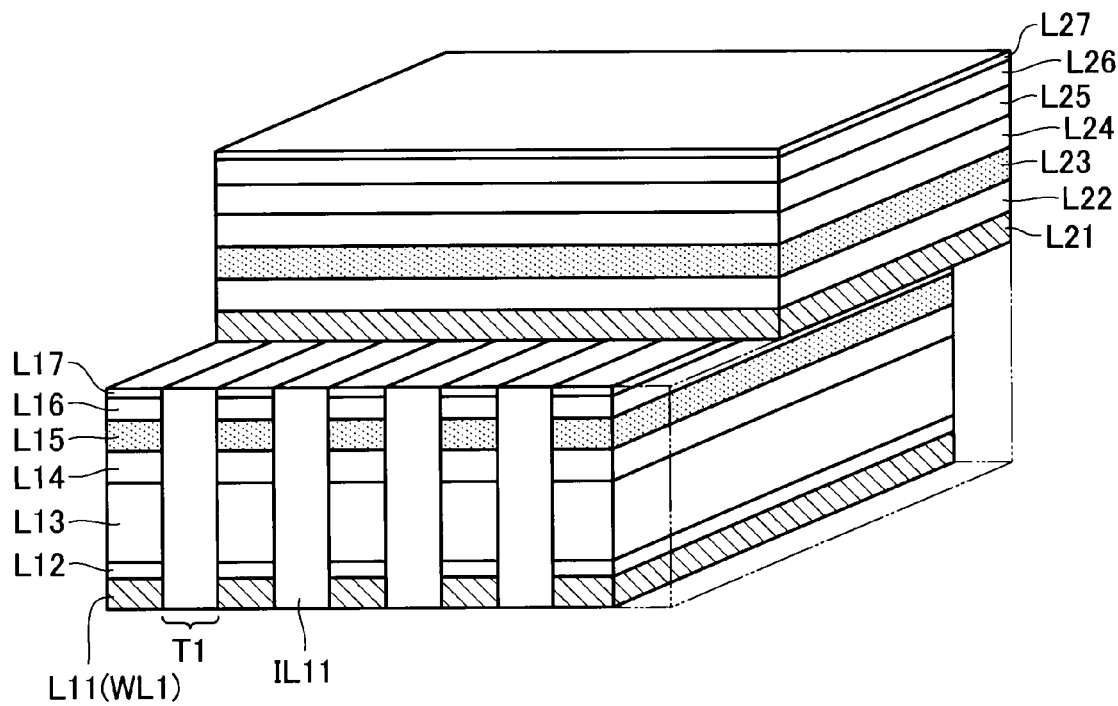
FIG. 9 is a perspective view showing a process step of manufacturing the semiconductor memory device according to the same embodiment.
Figure 10:
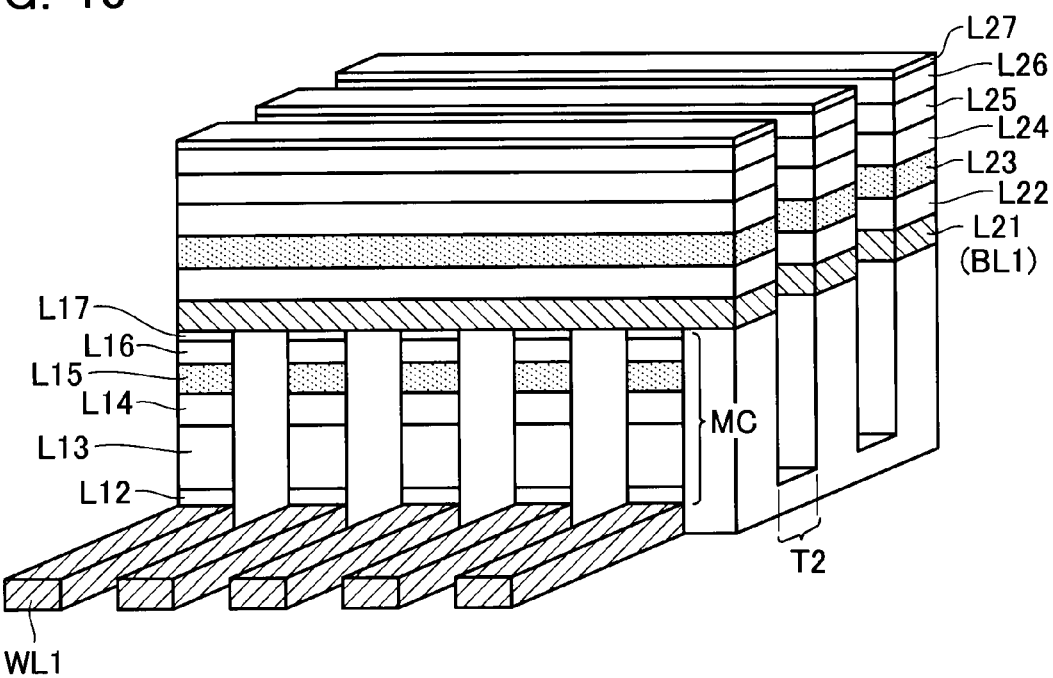
FIG. 10 is a perspective view showing a process step of manufacturing the semiconductor memory device according to the same embodiment.

Then, a hard mask of TEOS or the like, not shown, is formed on the upper surface of the stacked structure shown in FIG. 9, and a second anisotropic etching is executed with this mask, thereby forming trenches T2 extending in the row direction at a certain pitch, through the layers L21-L27 and L12-L17. The layer L21 is turned into the bit line BL1. Also at the end of the bit line BL1, a contact connector is formed with a mask of the pattern as shown in FIG. 7. This step turns the layers L12-L17 into a memory cell MC, which includes the barrier metal BM, the non-ohmic element NO, the electrode EL1, the variable resistive element VR, the electrode EL2, and the stopper ST.

Figure 11:
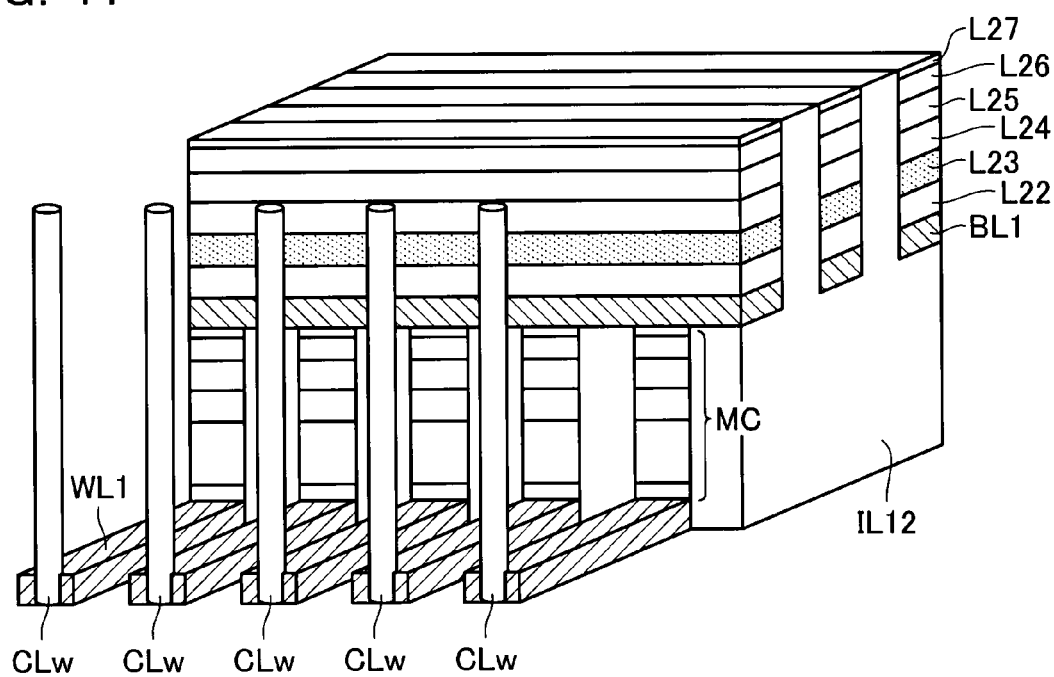
FIG. 11 is a perspective view showing a process step of manufacturing the semiconductor memory device according to the same embodiment.

Subsequently, an interlayer insulator IL12 is buried in the trenches T2. A suitable material of the interlayer insulator IL12 has excellent insulation, a low capacity, and an excellent burial property. Next, a process of planarization by CMP or the like is applied to remove extra parts from the interlayer insulator IL12 and expose the layer L27. The layer L27 (turned into the stopper ST later) plays a role in stopping the planarization by CMP at a certain position in the stack direction. A cross-sectional view after the planarization is shown in FIG. 11. At the step shown in FIG. 11, a contact plug CLw is formed in the peripheral area through the interlayer insulator IL12 (not shown). The contact plug CLw is formed in the contact connector formed at the end of word line WL1. The contact plug CLw is formed in contact with the lower line M1 (see FIG. 5) located beneath the word line WL.

Subsequently, layers L31-L37 are deposited in turn on the CMP-processed surface shown in FIG. 11. The layers L31-L37 later serve as the word line WL2, the barrier metal BM, the non-ohmic element NO, the electrode EL1, the variable resistive element VR, the electrode EL2 and the stopper ST. The state up to this step is shown in FIG. 12.

Figure 12:
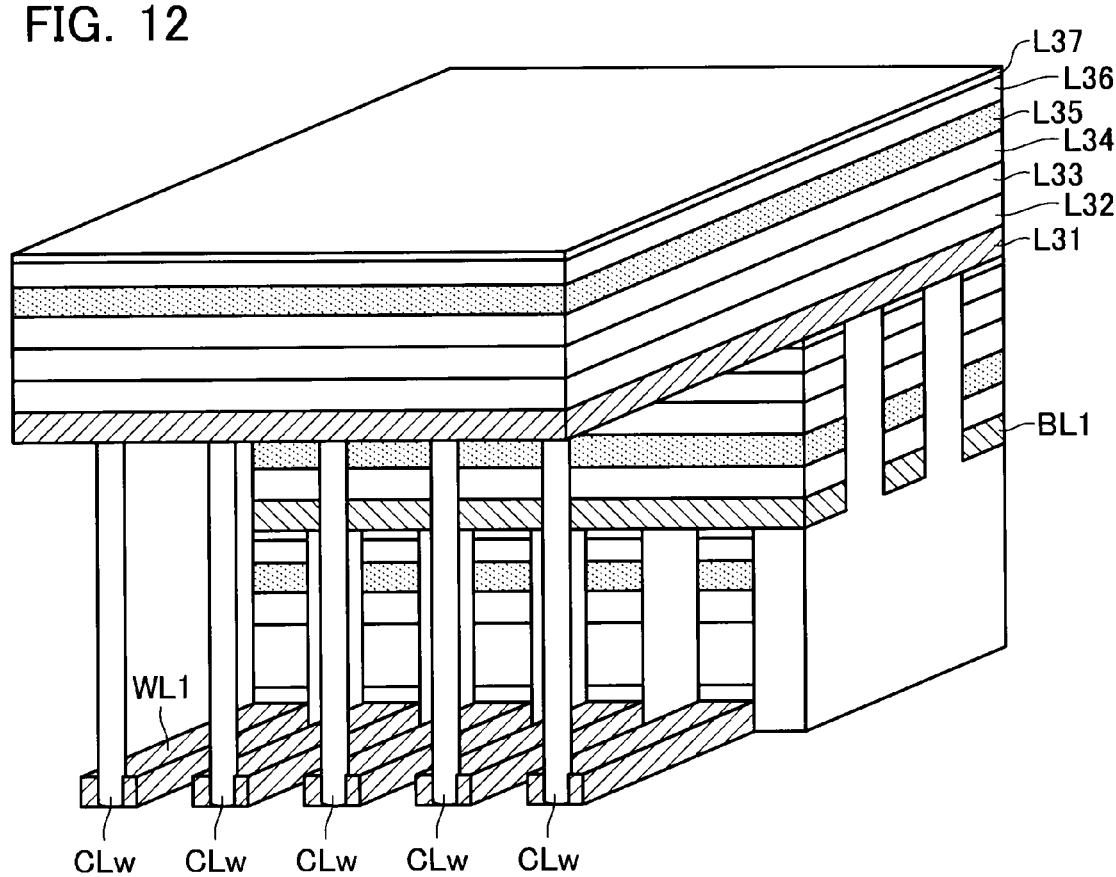
FIG. 12 is a perspective view showing a process step of manufacturing the semiconductor memory device according to the same embodiment.
Figure 13:
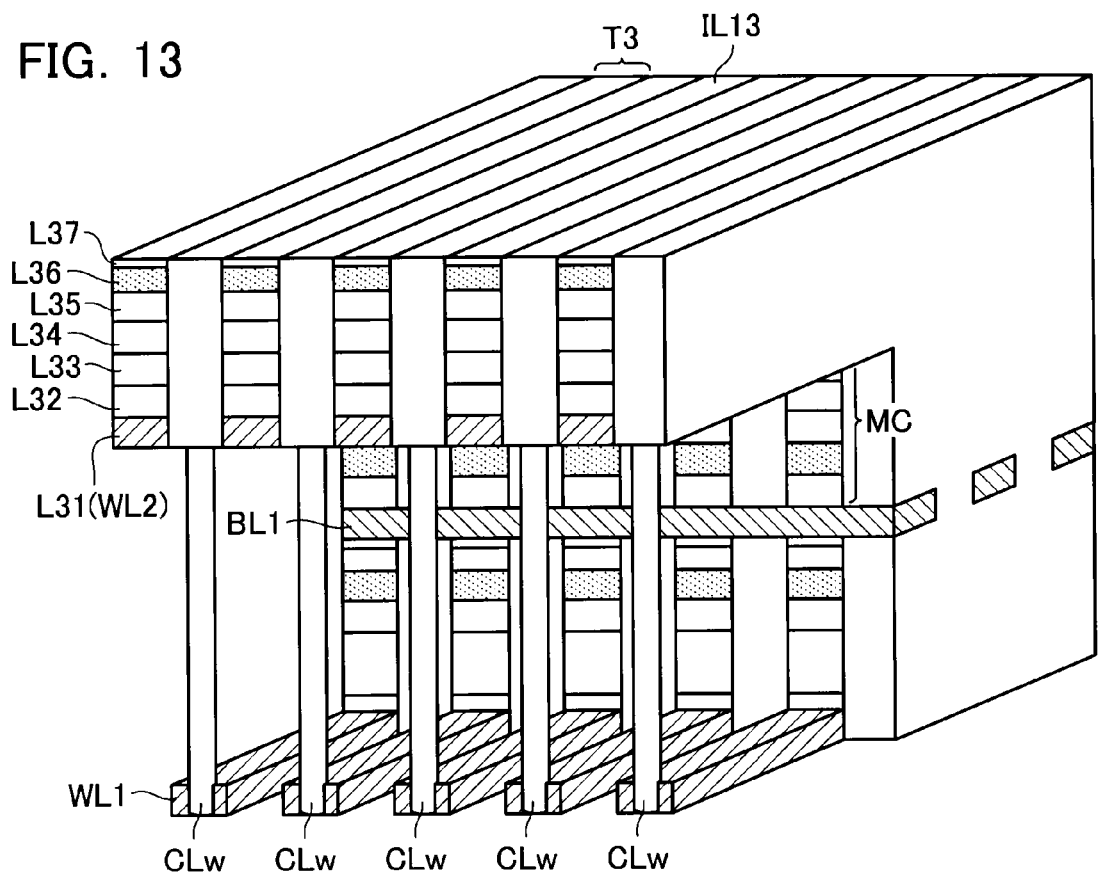
FIG. 13 is a perspective view showing a process step of manufacturing the semiconductor memory device according to the same embodiment.

Then, a hard mask of TEOS or the like, not shown, is formed on the upper surface of the stacked structure shown in FIG. 12, and a third anisotropic etching is executed with this mask, thereby forming trenches T3 extending in the row direction at a certain pitch, through the layers L31-L37 and L22-L27. The layer L31 is turned into the word line WL2. The contact connector at the end of the word line WL2 is formed with a mask of the pattern as shown in FIG. 6. The upper surface of the contact plug CLw comes in contact with the contact connector in the word line WL2. This step turns the layers L22-L27 into a memory MC, which includes the electrode EL2, the variable resistive element VR, the electrode EL1, the non-ohmic element NO, the barrier metal BM, and the stopper ST. Next, an interlayer insulator IL13 is buried in the trenches T3. A suitable material of the interlayer insulator IL13 has excellent insulation, a low capacity, and an excellent burial property. Subsequently, a process of planarization by CMP or the like is applied to remove extra parts from the interlayer insulator IL13 and expose the layer L37. The layer L37 (turned into the stopper ST later) plays a role in stopping the planarization by CMP at a certain position in the stack direction. A cross-sectional view after the planarization is shown in FIG. 13.

Subsequently, at the step shown in FIG. 14, a contact plug CLb is formed through the interlayer insulators IL11-IL13. The contact plug CLb is formed in contact with the contact connector formed at the end of the bit line BL1. The contact plug CLb is formed in contact with the lower line M1 (see FIG. 5) located beneath the word line WL.

Figure 14:
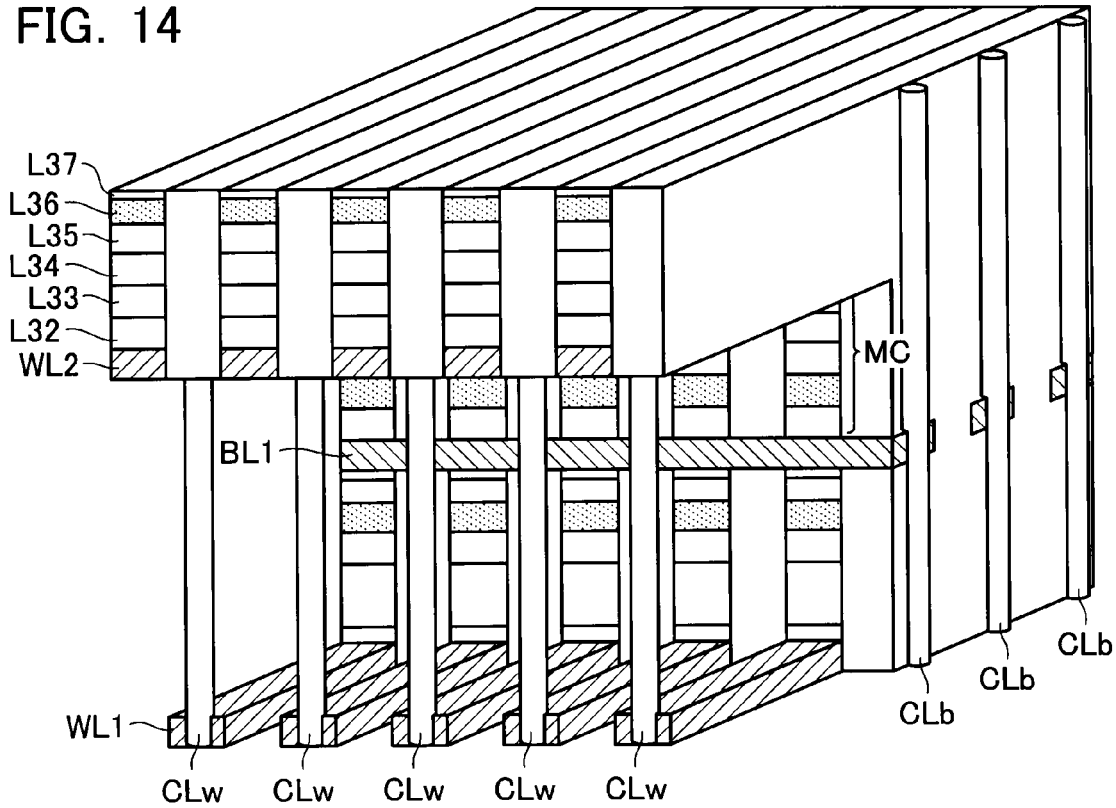
FIG. 14 is a perspective view showing a process step of manufacturing the semiconductor memory device according to the same embodiment.
Figure 15:
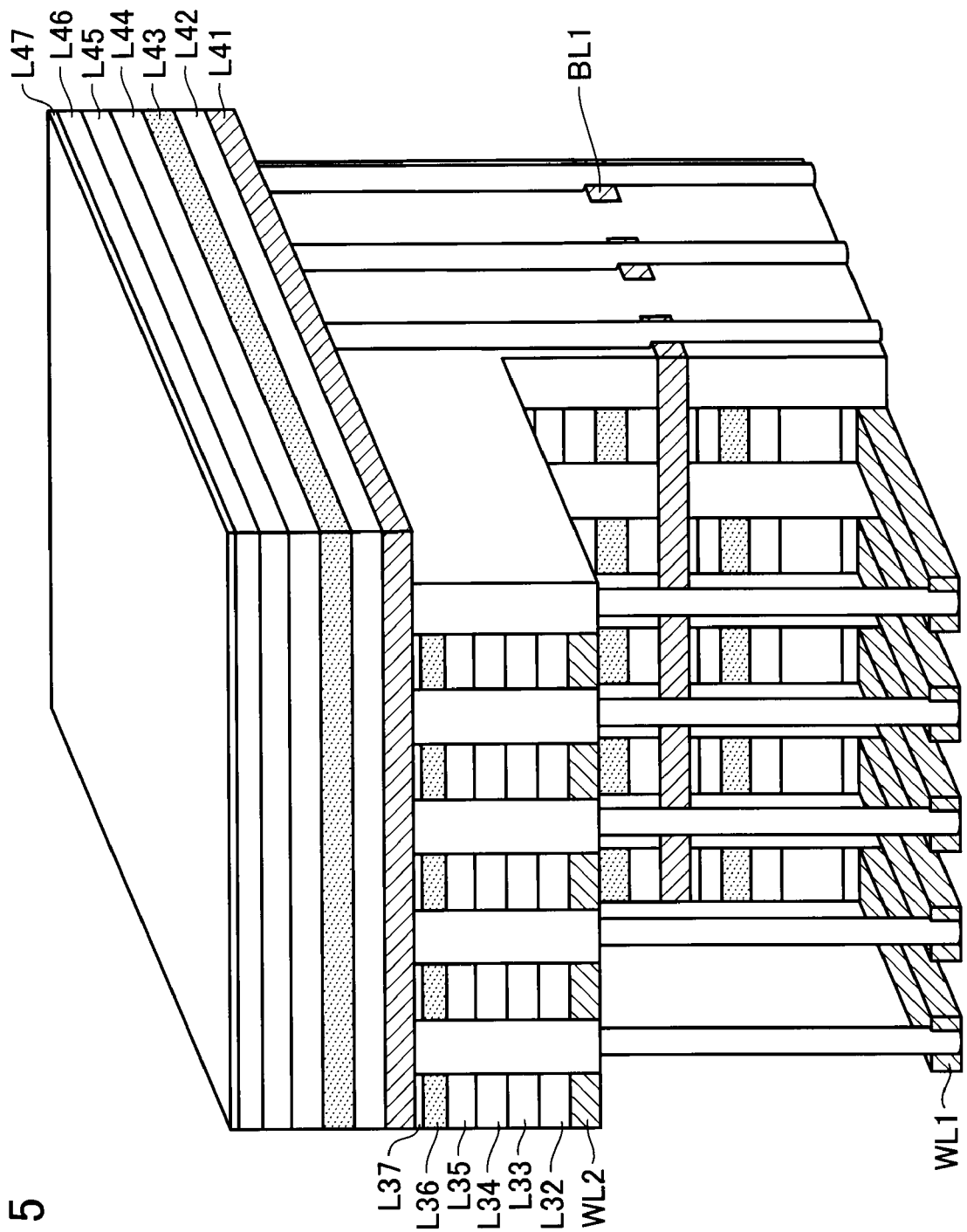
FIG. 15 is a perspective view showing a process step of manufacturing the semiconductor memory device according to the same embodiment.

Then, layers L41-L47 are deposited in turn as shown in FIG. 15 on the CMP-processed surface shown in FIG. 14. The layers L41-L47 later serve as the bit line BL2, the electrode EL2, the variable resistive element VR, the electrode EL1, the non-ohmic element NO, the barrier metal BM, and the stopper ST.

Subsequently, a hard mask of TEOS or the like, not shown, is formed on the upper surface of the stacked structure shown in FIG. 15, and a fourth anisotropic etching is executed with this mask, thereby forming trenches T4 extending in the column direction at a certain pitch, through the layers L41-L47 and L32-L37. The layer L41 is turned into the bit line BL2. The contact connector at the end of the bit line BL2 is formed with a mask of the pattern as shown in FIG. 6. The upper surface of the contact plug CLb comes in contact with the end of the bit line BL2. This step turns the layers L32-L37 into a memory MC, which includes the barrier metal BM, the non-ohmic element NO, the electrode EL1, the variable resistive element VR, the electrode EL2, and the stopper ST.

Next, an interlayer insulator IL14 is buried in the trenches T4. A suitable material of the interlayer insulator IL14 has excellent insulation, a low capacity, and an excellent burial property. Subsequently, a process of planarization by CMP or the like is applied to remove extra parts from the interlayer insulator IL14 and expose the layer L47. The layer L47 (turned into the stopper ST later) plays a role in stopping the planarization by CMP at a certain position in the stack direction. A cross-sectional view after the planarization is shown in FIG. 16.

Figure 16:
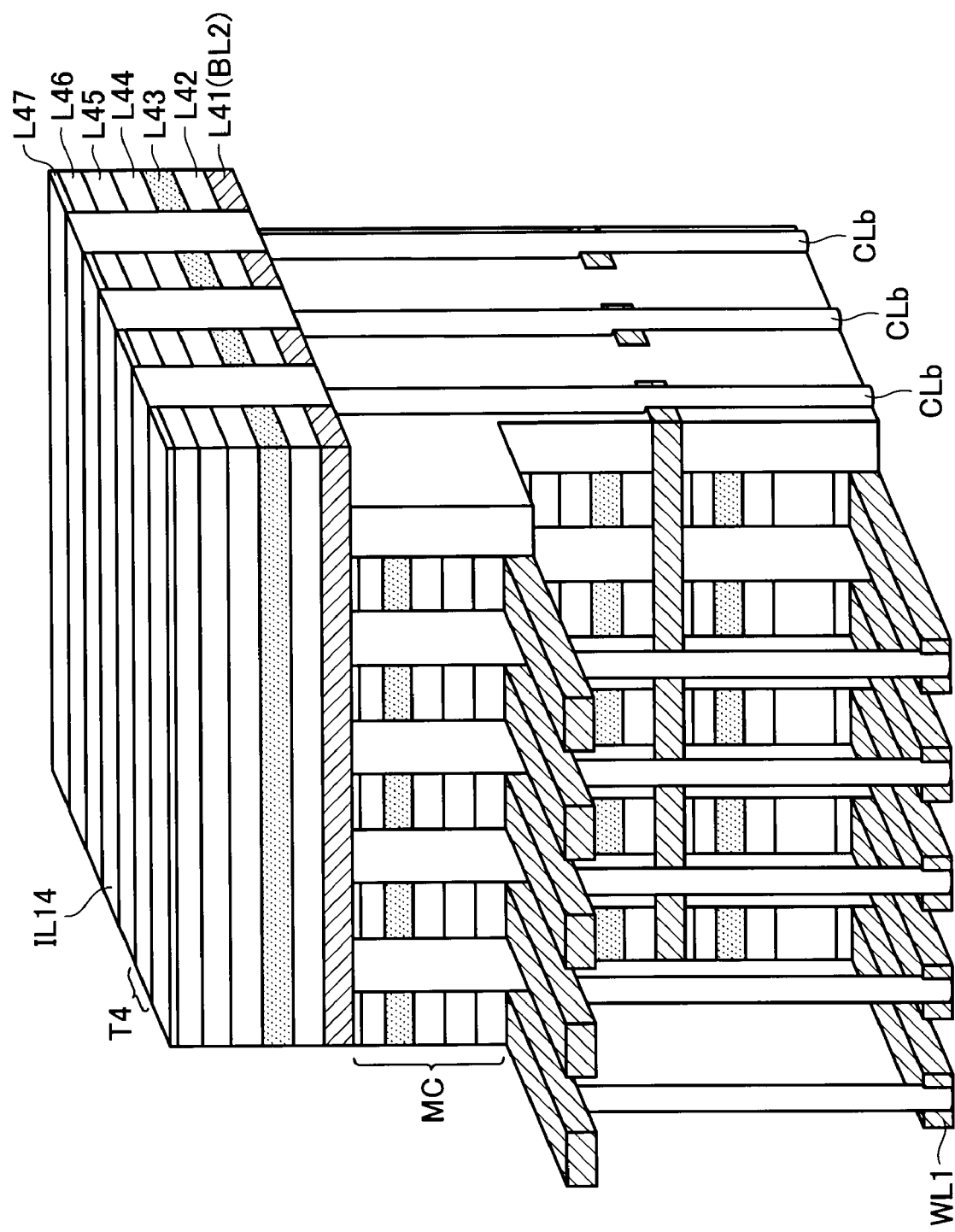
FIG. 16 is a perspective view showing a process step of manufacturing the semiconductor memory device according to the same embodiment.
Figure 17:
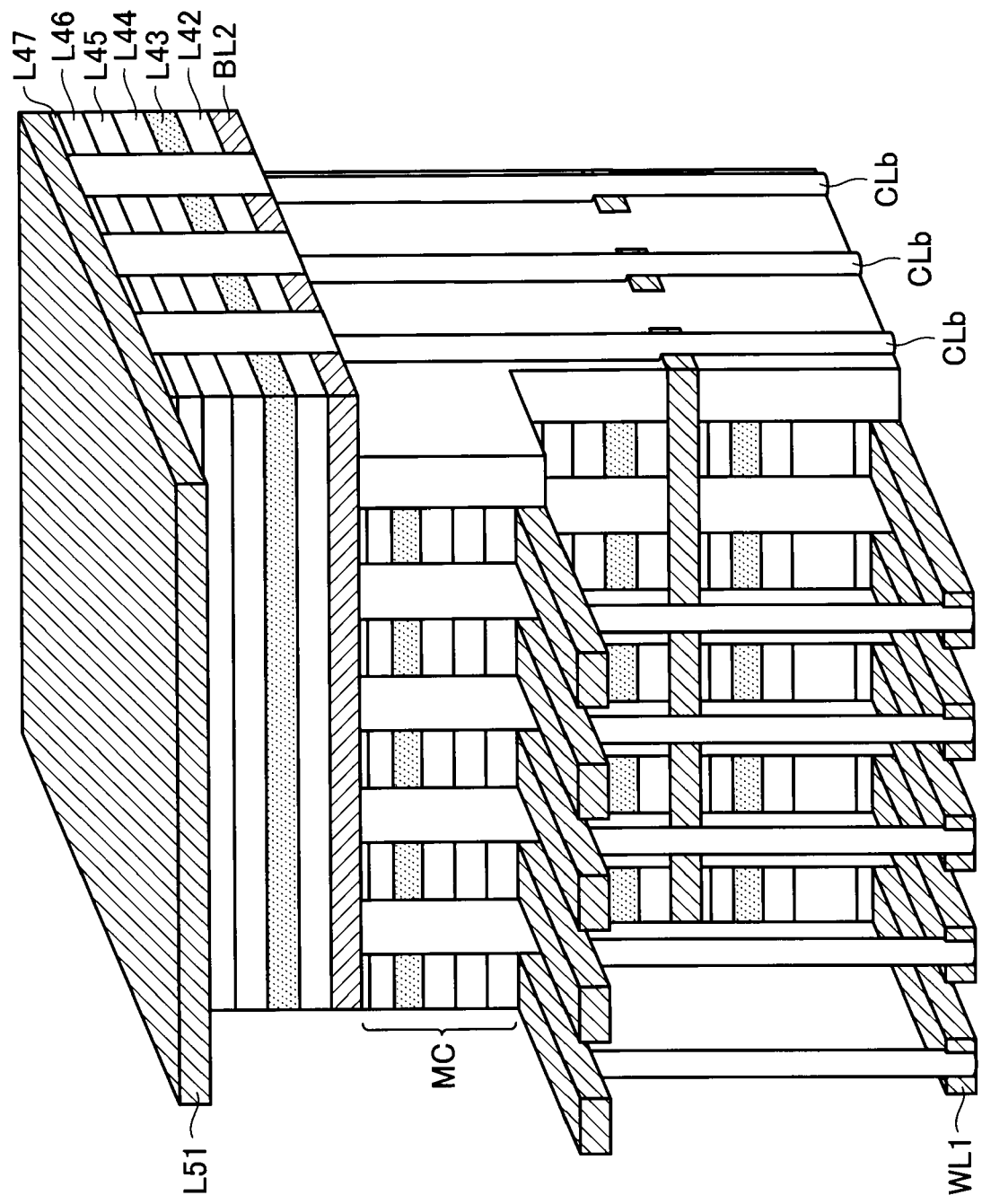
FIG. 17 is a perspective view showing a process step of manufacturing the semiconductor memory device according to the same embodiment.

Then, a layer L51 is deposited as shown in FIG. 17 on the CMP-processed surface shown in FIG. 16. The layer L51 later serves as the word line WL3.

Figure 18:
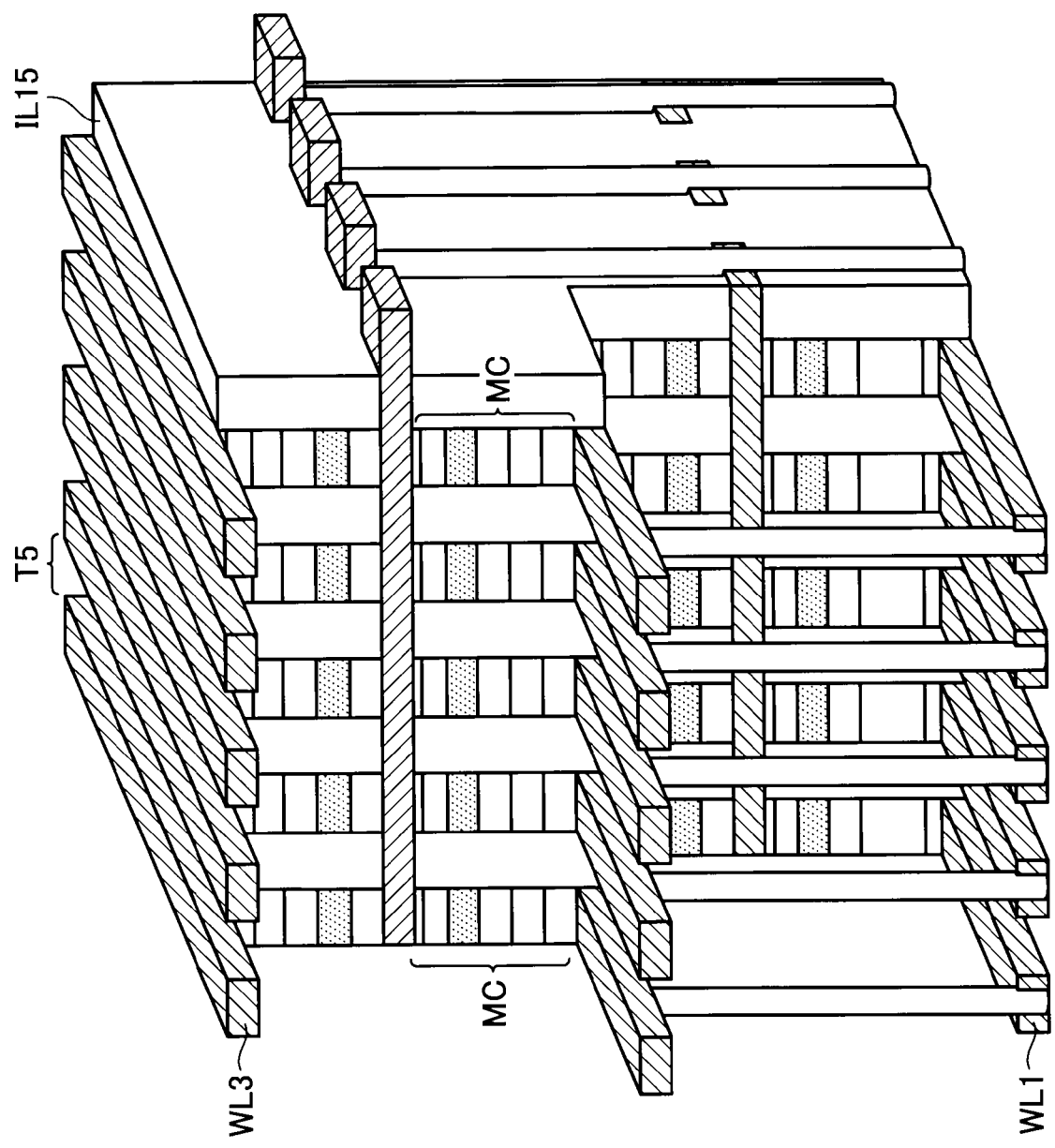
FIG. 18 is a perspective view showing a process step of manufacturing the semiconductor memory device according to the same embodiment.

Subsequently, a hard mask of TEOS or the like, not shown, is formed on the upper surface of the layer L51 shown in FIG. 17, and a fifth anisotropic etching is executed with this mask, thereby forming trenches T5 extending in the row direction at a certain pitch, through the layers L51, L42-L47. The layer L51 is turned into the word line WL3. The contact connector at the end of the word line WL3 is formed with a mask of the pattern as shown in FIG. 6. This step turns the layers L42-L47 into a memory MC, which includes the electrode EL2, the variable resistive element VR, the electrode EL1, the non-ohmic element NO, the barrier metal BM, and the stopper ST. Next, an interlayer insulator IL15 is buried in the trenches T5. A suitable material of the interlayer insulator IL15 has excellent insulation, a low capacity, and an excellent burial property. The state up to this step is shown in FIG. 18.

Figure 19:
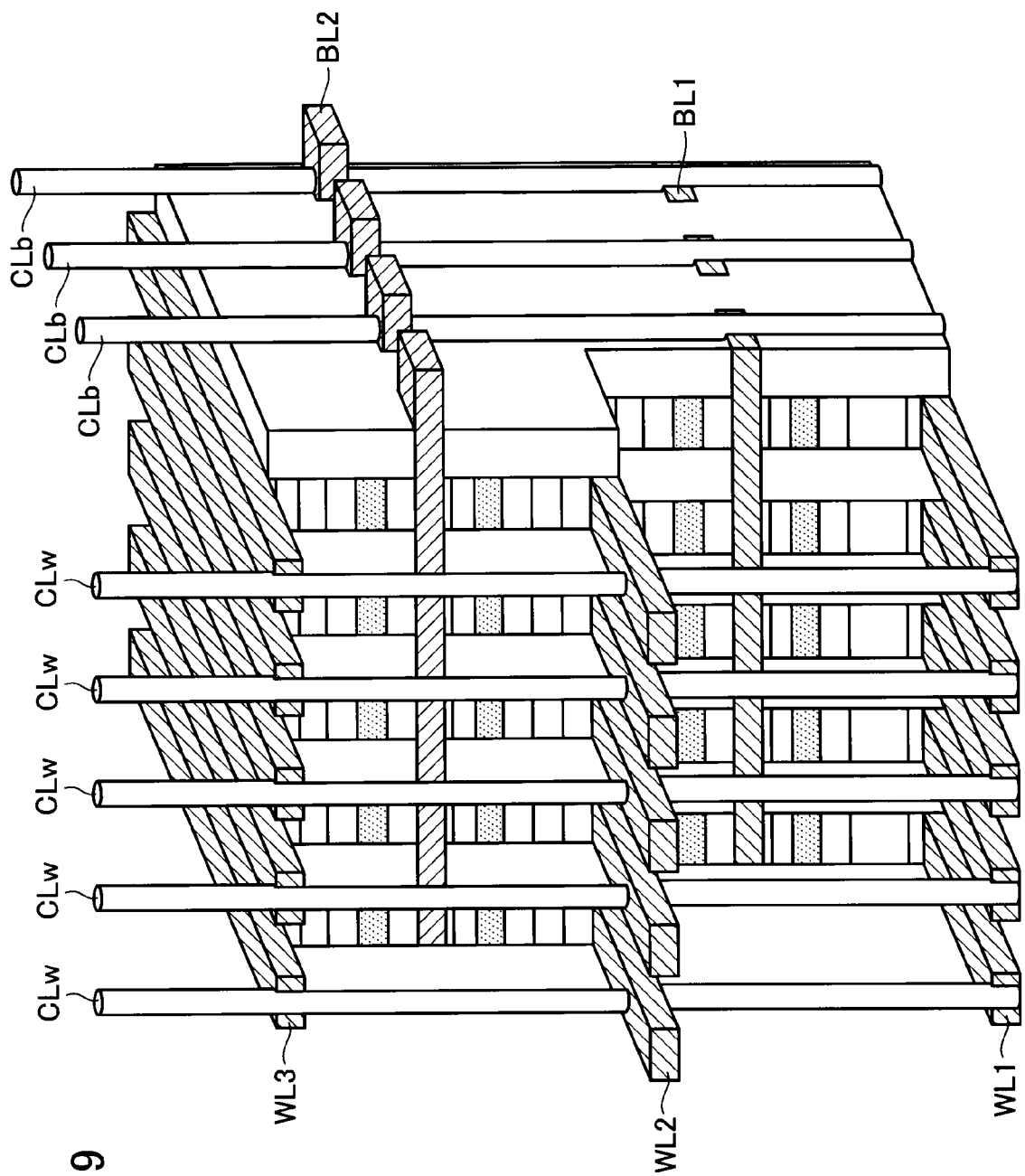
FIG. 19 is a perspective view showing a process step of manufacturing the semiconductor memory device according to the same embodiment.

Then, a different interlayer insulator is deposited on the interlayer insulator IL15. Thereafter, a contact plug CLw is formed through the interlayer insulators IL16-IL13. The contact plug CLw is formed in the contact connector formed at the end of the word line WL3. The contact plug CLw is formed in contact with the upper surface of the word line WL2 at the end. In addition, a contact plug CLb is formed through the interlayer insulators IL16-IL14. The contact plug CLb is formed in contact with the upper surface of the bit line BL2 at the end. A cross-sectional view after these processes is shown in FIG. 19.

Figure 20:
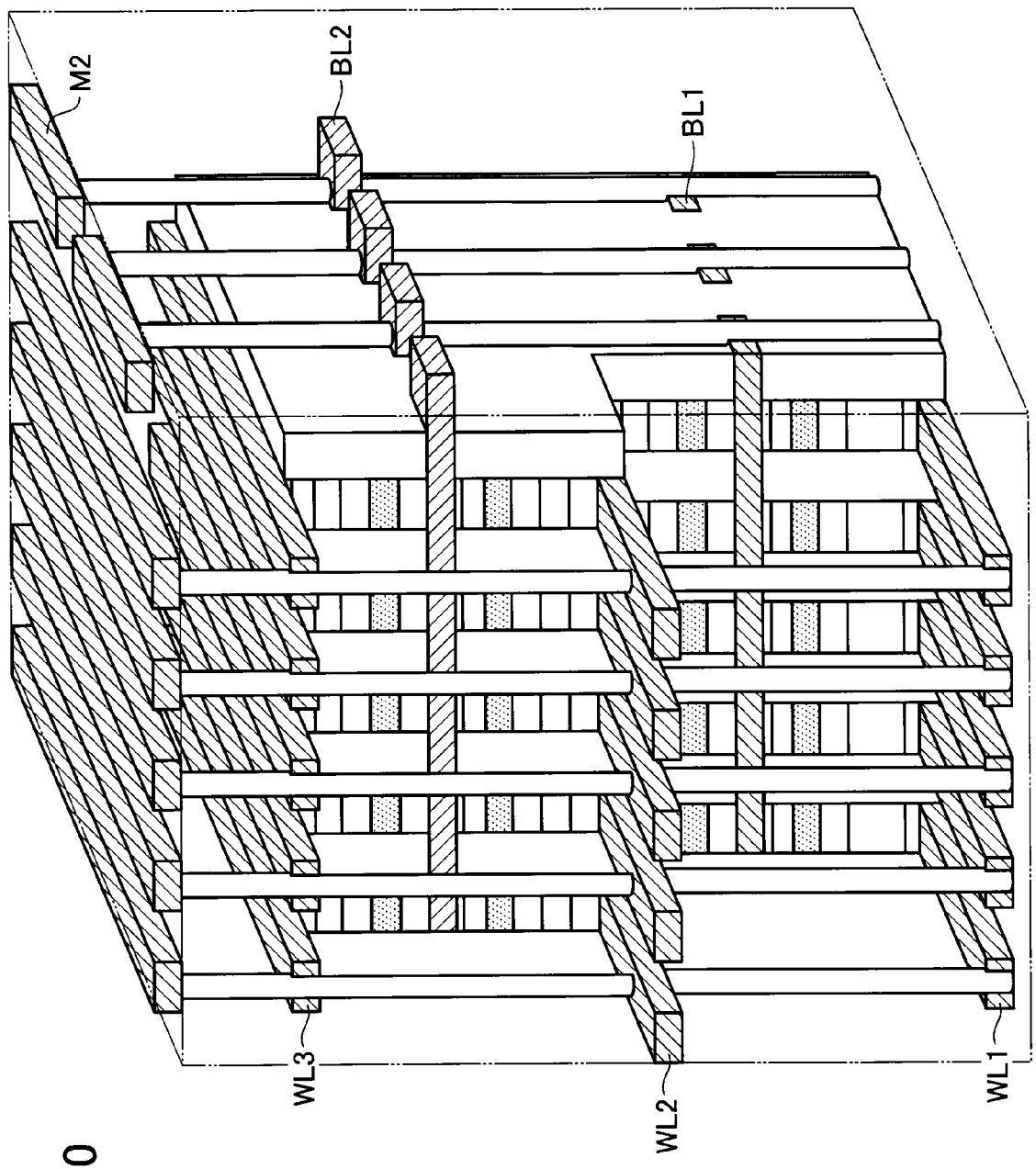
FIG. 20 is a perspective view showing a process step of manufacturing the semiconductor memory device according to the same embodiment.

An upper line layer M2 is formed on the upper portion of the interlayer insulator IL6 (the upper surface of the contact plug CL) to complete the semiconductor memory device shown in FIG. 20.

The present embodiment makes it possible to reduce the sectional area of the contact plug and the area of the contact connector in each layer in the semiconductor memory device having a stacked structure without any increases in contact resistance caused by interlayer connections.

[Second Embodiment]

Figure 21:
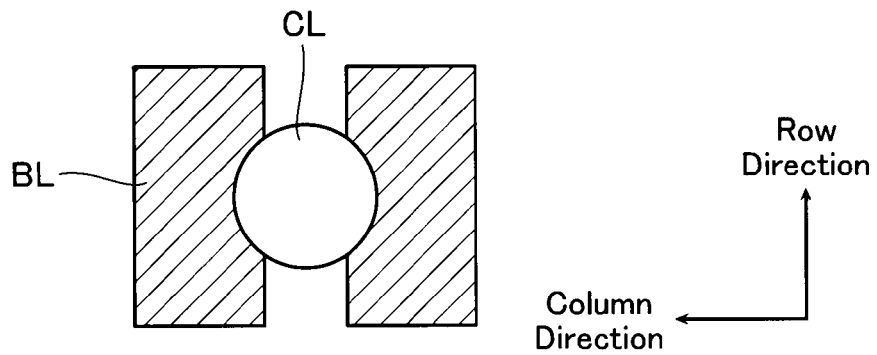
FIG. 21 provides a top view of a bit line and a cross-sectional view of a contact plug in a semiconductor memory device according to a second embodiment of the present invention.
Figure 22:
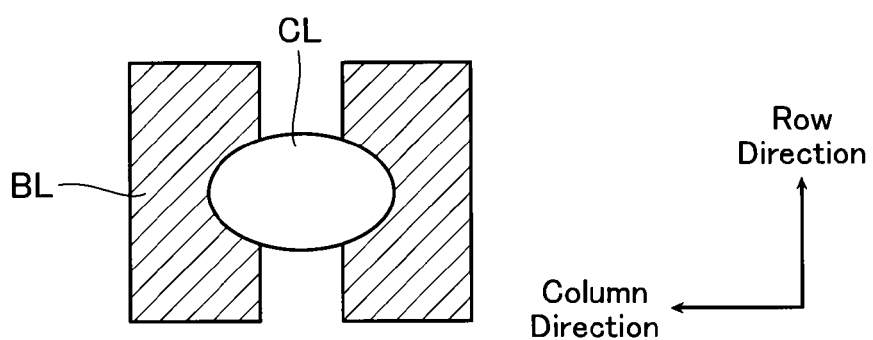
FIG. 22 provides a top view of a bit line and a cross-sectional view of a contact plug in another semiconductor memory device according to the same embodiment.

FIGS. 21 and 22 show shapes of a contact connector and a contact plug in a semiconductor memory device according to a second embodiment of the present invention, or sectioned shapes with a surface normal in the stack direction of the semiconductor memory device.

The sectioned shape of the contact plug is not limited to a particular sectioned shape. For example, it may be a circular shape as shown in FIG. 21 or an elliptical shape having the major axis in the column direction as shown in FIG. 22 to exert the same effect as the first embodiment. In the case of the elliptical shape, the influence exerted on the contact area of the contact plug with the contact connector due to the deviation of the contact plug in the column direction can be made lower than the circular shape.

[Third Embodiment]

Figure 23:
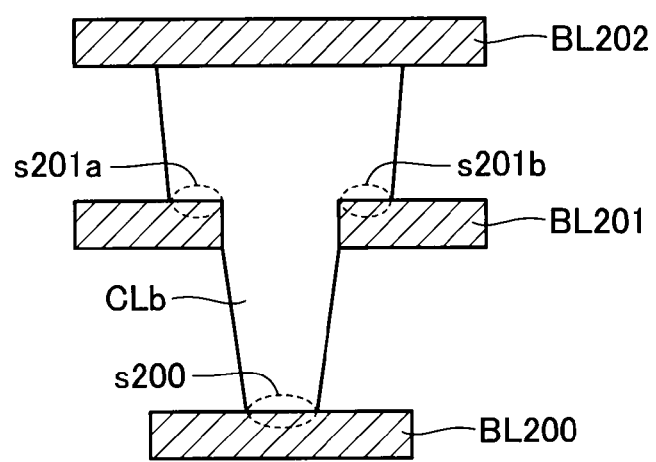
FIG. 23 shows sectioned shapes of a contact connector and a contact plug with a word line used as a surface normal in a semiconductor memory device according to a third embodiment of the present invention.
Figure 24:
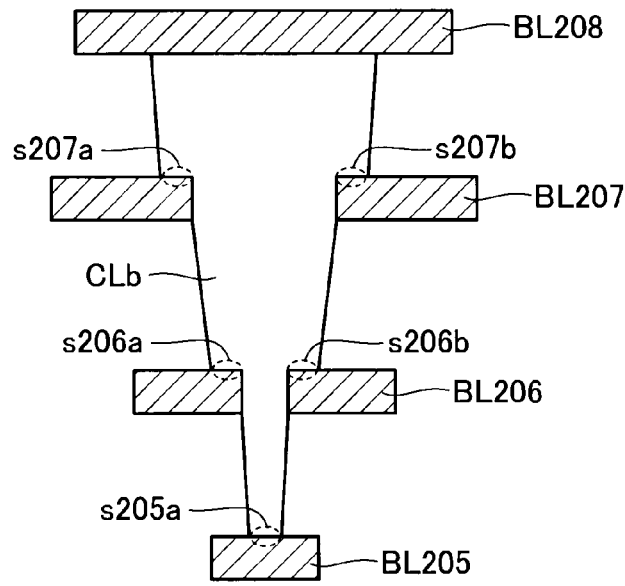
FIG. 24 shows sectioned shapes of a contact connector and a contact plug with a word line used as a surface normal in another semiconductor memory device according to the same embodiment.

FIGS. 23 and 24 show shapes of a contact connector and a contact plug in a semiconductor memory device according to a third embodiment of the present invention, or sectioned shapes with a surface normal in the stack direction of the semiconductor memory device.

The contact plug CL of FIG. 23 connects among bit lines BL200, BL201 and BL202. In this case, a sum of contact areas s201a, s201b between the contact plug CLb and the bit line BL201, and a contact area s200 between the contact plug CLb and the bit line BL200 are equated, thereby equating the connection resistances between the contact plug CLb and the bit lines BL200, BL201.

The contact plug CLb of FIG. 24 connects among bit lines BL205-BL208. In this case, a sum of contact areas s207a, s207b between the contact plug CLb and the bit line BL207, a sum of contact areas s206a, s206b between the contact plug CLb and the bit line BL206, and a contact area s205 between the contact plug CLb and the bit line BL205 are equated. Also in this case, the connection resistances between the contact plug CLb and the bit lines BL205-BL207 are equated, like in the case of FIG. 23.

The present embodiment not only exerts the same effect as the first embodiment but also can equate the contact areas of the contact plug with the contact connector in the lines to suppress the variations in characteristic among the bit lines.

FIGS. 23 and 24 describe the connections between the bit line BL and the contact plug CLb while the connections between the word line WL and the contact plug CLw may be treated similarly.

What is claimed is:

1. A semiconductor memory device, comprising:
  a semiconductor substrate;
  a cell array block formed on said semiconductor substrate and including plural stacked cell array layers each comprising a plurality of first lines, a plurality of second lines crossing said plurality of first lines, and memory cells connected at intersections of said first and second lines between both lines; and a plurality of contact plugs which are substantially pillar-shaped bodies having the stack direction of said cell array layers as a height direction, and which are configured to connect between said first lines, between said second lines, between said first or second line and said semiconductor substrate, or between said first or second line and another metal line, in said cell array layers, wherein said first or second line in a certain one of said cell array layers has a contact connector making contact with said contact plug in at least two places facing each other in a direction orthogonal to said stack direction on sides of said contact plug.

2. The semiconductor memory device according to claim 1, wherein said contact plug has a circular section orthogonal to the stack direction of said cell array layers.

3. The semiconductor memory device according to claim 1, wherein said contact plug has an elliptical section orthogonal to the stack direction of said cell array layers.

4. The semiconductor memory device according to claim 1, wherein contact portions of said contact plug with said semiconductor substrate and said first and second lines in said cell array layers have an identical total contact area in at least two layers.

5. The semiconductor memory device according to claim 1, wherein said contact plug has a step formed above the upper surface of said first or second line to be connected, said contact connector of said certain first or second line includes two parallel plate portions formed sandwiching both sides of said contact plug immediately beneath said step.

6. The semiconductor memory device according to claim 1, wherein said memory cell includes an electrically erasable programmable resistive element nonvolatilely storing a resistance as data.

7. The semiconductor memory device according to claim 6, wherein said memory cell further includes a non-ohmic element serially connected to said resistive element.

8. A semiconductor memory device, comprising:
a semiconductor substrate;
a cell array block formed on said semiconductor substrate and including plural stacked cell array layers each comprising a plurality of first lines, a plurality of second lines crossing said plurality of first lines, and memory cells connected at intersections of said first and second lines between both lines; and
a plurality of contact plugs which are substantially pillar-shaped bodies having the stack direction of said cell array layers as a height direction, and which are configured to connect between said first lines, between said second lines, between said first or second line and said semiconductor substrate, or between said first or second line and another metal line, in said cell array layers, wherein said first or second line in a certain one of said cell array layers has a pair of contact connectors formed sandwiching the side of said contact plug from both sides in a direction orthogonal to said stack direction.

9. The semiconductor memory device according to claim 8, wherein said memory cell includes an electrically erasable programmable resistive element nonvolatilely storing a resistance as data, and a non-ohmic element serially connected to said resistive element.

10. The semiconductor memory device according to claim 8, wherein said contact plug has a circular section orthogonal to the stack direction of said cell array layers.

11. The semiconductor memory device according to claim 8, wherein said contact plug has an elliptical section orthogonal to the stack direction of said cell array layers.

12. The semiconductor memory device according to claim 8, wherein contact portions of said contact plug with said semiconductor substrate and said first and second lines in said cell array layers have an identical total contact area in at least two layers.

13. The semiconductor memory device according to claim 8, wherein said contact plug has a step formed above the upper surface of said first or second line to be connected, said contact connectors of said certain first or second line include two parallel plate portions formed sandwiching both sides of said contact plug immediately beneath said step.

* * * * *